United States Patent
Nakamura

(10) Patent No.: US 6,731,494 B2
(45) Date of Patent: May 4, 2004

(54) CAPACITOR AND METHOD FOR FABRICATING THE SAME AND SEMICONDUCTOR DEVICE

(75) Inventor: Shunji Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/352,028

(22) Filed: Jan. 28, 2003

(65) Prior Publication Data

US 2003/0184950 A1 Oct. 2, 2003

(30) Foreign Application Priority Data

Feb. 8, 2002 (JP) ........................................ 2002-032406

(51) Int. Cl.⁷ .............................................. H01G 4/228
(52) U.S. Cl. ................ 361/306.1; 361/321.1; 361/321.5; 361/311; 361/320; 438/393; 438/396
(58) Field of Search .................. 361/306.1, 306.3, 361/321.1, 321.5, 321.3, 311, 313, 32, 321.4; 438/393, 396, 612, 678, 650, 686

(56) References Cited

U.S. PATENT DOCUMENTS

| | | | | |
|---|---|---|---|---|
| 5,978,207 | A | * | 11/1999 | Anderson et al. |
| 6,198,617 | B1 | * | 3/2001 | Sun |
| 6,552,384 | B2 | * | 4/2003 | Murata et al. |
| 2002/0056869 | A1 | * | 5/2002 | Morimoto |
| 2002/0155626 | A1 | * | 10/2002 | Park |

FOREIGN PATENT DOCUMENTS

JP  11-97535  4/1999

OTHER PUBLICATIONS

Hiroshi Horie et al.; International Electron Device Meeting, pp. 946–948, 1996.
S. Nakamura et al.; Symposium on VLSI Technology Digest of Technical Papers, 4A-2, pp. 35–36, 1999.

* cited by examiner

Primary Examiner—Dean A. Reichard
Assistant Examiner—Nguyen T. Ha
(74) Attorney, Agent, or Firm—Westerman, Hattori, Daniels & Adrian, LLP

(57) ABSTRACT

A capacitor 19 comprises a lower electrode 14 formed on a substrate 10, an upper electrode 18 opposed to the lower electrode, and a capacitor dielectric film 16 formed between the lower electrode and the upper electrode, in which at least one of the lower electrode and the upper electrodes is an electrode of a metal substituted layer. The lower electrodes of polysilicon are formed, and then after the high-temperature heat processing for improving film quality of the capacitor dielectric film has been performed, the lower electrodes of polysilicon is substituted with aluminum to form the lower electrodes of aluminum, whereby aluminum, which cannot withstand the heat processing for improving film quality of the capacitor dielectric film can be used as a material of the lower electrodes. Thus, capacitors having good high-speed response can be formed.

17 Claims, 25 Drawing Sheets

CAPACITOR AND METHOD FOR FABRICATING THE SAME AND SEMICONDUCTOR DEVICE

CROSS-REFERENCE TO RELATED APPLICATION

This application is based upon and claims priority of Japanese Patent Application No. 2002-32406, filed on Feb. 8, 2002, the contents being incorporated herein by reference.

BACKGROUND OF THE INVENTION

The present invention relates to a capacitor and a method for fabricating the same, and a semiconductor device including the capacitor.

Conventionally, capacitors have been formed in a semiconductor device, such as memory devices, DRAM, FRAM, etc., RF devices, analogue devices or logic devices, etc.

The capacitors comprise lower electrodes, a capacitor dielectric film formed on the lower electrodes, and upper electrodes formed on the capacitor dielectric film.

Capacitors using as materials of the lower electrodes and the upper electrodes semiconductors, such as polysilicon, amorphous silicon, etc. are called capacitors of SIS (Silicon Insulator Silicon) structure.

Capacitors using semiconductors as materials of the lower electrodes and metals as materials of the upper electrodes are called capacitors of SIM (Silicon Insulator Metal) structure.

The capacitors of SIS structure and the capacitors of MIS structure use semiconductors, such as polysilicon, etc. in at least the lower electrodes, and the electric resistance of the electrodes are relatively high. The capacitors cannot have good high-speed response.

Then, recently capacitors of MIM (Metal Insulation Metal) structure using metals as materials of the lower electrodes and the upper electrodes are proposed. The capacitors of MIM structure use metals both in the lower and the upper electrodes, and accordingly, the lower electrodes and the upper electrodes have low electric resistances. The capacitors can have good high-speed response.

To form capacitors having good electric characteristics, after the lower electrodes and the capacitor dielectric films have been formed, heat processing of a temperature of above 650° C. at lowest must be performed for improving film quality of the capacitor dielectric films. Improved film quality of the capacitor dielectric film is very important to improve voltage resistance of the capacitors and decrease leak current. As metals which can bear the high-temperature heat processing are considered W (tungsten), WN, TiN, Ru, RuO, etc. These materials have relatively high resistivities. Specifically, the resistivity of W is about 6–9 $\mu\Omega\cdot$cm, the resistivity of WN is about 50 $\mu\Omega\cdot$cm, the resistivity of TiN is about 50 $\mu\Omega\cdot$cm, the resistivity of Ru is about 10–15 $\mu\Omega\cdot$cm, and the resistivity of RuO is about 140 $\mu\Omega\cdot$cm. On the other hand, Al, which has a low resistivity of 2.7 $\mu\Omega\cdot$cm but has a low melting point of 630° C., cannot unusably withstand the high-temperature heat processing described above. Accordingly, it has been conventionally impossible to form the capacitors of good high-speed response by using materials of low resistivities, such as Al, as materials of the lower electrodes.

When the heat processing for improving film quality of the capacitor dielectric film is performed after the lower electrodes and the capacitor dielectric film which are formed of metals, there is a risk that the lower electrodes will deprive oxygen from the capacitor dielectric film to resultantly deteriorate, to the contrary, film quality of the capacitor dielectric film.

The fabrication process of semiconductor devices is divided largely in bulk steps and layer steps. In the bulk steps, heat processing of high temperatures of about 1000° C. are performed, and when metal electrodes are formed in a bulk step, there is a risk of metal contamination. Accordingly, the metal electrodes cannot be formed in a bulk steps. Thus, the capacitors using the metal electrodes cannot be formed on a layer to be formed in a bulk step.

SUMMARY OF THE INVENTION

An object of the present invention is to provide a capacitor of good high-speed response and a method for fabricating the capacitor, and a semiconductor device including the capacitor.

According to one aspect of the present invention, there is provided a capacitor comprising a lower electrode formed on a substrate, an upper electrode opposed to the lower electrode, and a capacitor dielectric film formed between the lower electrode and the upper electrode, at least one of the lower electrode and the upper electrode being an electrode of a metal substituted layer.

According to another aspect of the present invention, there is provided a method for fabricating a capacitor comprising the steps of: forming a lower electrode on a substrate; forming a capacitor dielectric film on the lower electrode; forming an upper electrode on the capacitor dielectric film; forming an insulation film on the upper electrode; forming an opening in the insulation film down to the lower electrode; forming a metal layer on the insulation film; and substituting a constituent atom of the lower electrode with a metal atom of the metal layer through the opening to thereby form the lower electrode of a metal substituted layer.

According to further another aspect of the present invention, there is provided a method for fabricating a capacitor comprising the steps of: forming a lower electrode on a substrate; forming a capacitor dielectric film on the lower electrode; forming an upper electrode on the capacitor dielectric film; forming an insulation film on the upper electrode; forming in the insulation film a first opening down to the lower electrode and a second opening down to the upper electrode; forming a metal layer on the insulation film; and substituting a constituent atom of the lower electrode with a metal atom of the metal layer through the first opening to thereby form the lower electrode of a metal substituted layer and substituting a constituent atom of the upper electrode with a metal atom of the metal layer through the second opening to thereby form the upper electrode of a metal substituted layer.

According to further another aspect of the present invention, there is provided a method for fabricating a capacitor comprising the steps of: forming a lower electrode on a substrate; forming a capacitor dielectric film on the lower electrode; forming an upper electrode on the capacitor dielectric film; forming an insulation film on the upper electrode; forming an opening in the insulation film down to the upper electrode; forming a metal layer on the insulation film; and substituting a constituent atom of the upper electrode with a metal atom of the metal layer through the opening to form the upper electrode of a metal substituted layer.

According to further another aspect of the present invention, there is provided a semiconductor device comprising a capacitor including a lower electrode formed on a substrate, an upper electrode opposed to the lower electrode, and a capacitor dielectric film formed at least between the lower electrode and the upper electrode; and at least one of the lower electrode and the upper electrode is an electrode of a metal substituted layer.

According to the present invention, the lower electrodes of polysilicon are formed, and then after the high-temperature heat processing for improving film quality of the capacitor dielectric film has been performed, the lower electrodes of polysilicon is substituted with aluminum to form the lower electrodes of aluminum, whereby aluminum, which cannot withstand the heat processing for improving film quality of the capacitor dielectric film can be used as a material of the lower electrodes. Thus, according to the present invention, capacitors having good high-speed response can be formed.

According to the present invention, the lower electrodes and the upper electrodes of polysilicon are formed, and then the polysiliocn is substituted with aluminum to form the lower electrodes and the upper electrodes of aluminum. Thus, according to the present invention, capacitors having metal electrodes can be formed on a layer formed by a bulk step, where high-temperature processing is performed.

According to the present invention, the divided sectional electrodes of polysilicon are substituted with aluminum, whereby a volume of the sectional electrodes each of which is to be substituted through one opening formed in each sectional electrode can be small. Thus, according to the present invention, the lower electrodes can be substituted with aluminum for a short period of time, and the lower electrodes can be substituted with aluminum without failure.

According to the present invention, polysilicon is substituted with aluminum through the openings formed down to both sides of the sectional electrodes of polysilicon, whereby a period of time in which the sectional electrodes of polysilicon are substituted with aluminum can be half.

According to the present invention, the polysilicon layer is partially left not substituted, whereby capacitors having variable electrostatic capacities can be provided.

DETAILED DESCRIPTION OF THE INVENTION

A First Embodiment

Figure 1A:
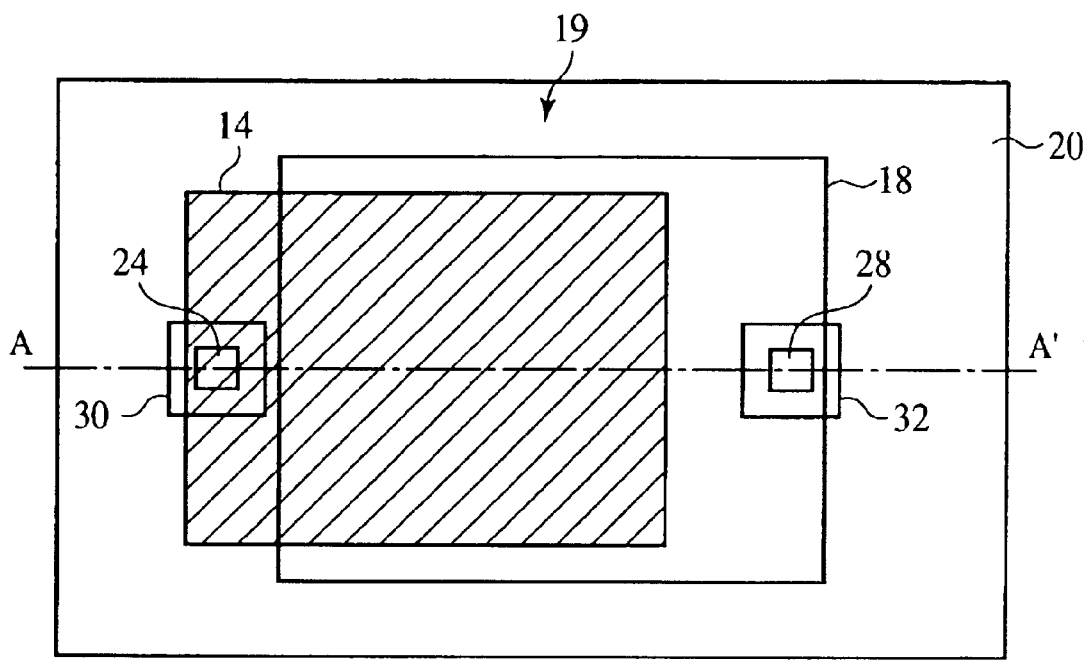
FIGS. 1A and 1B are diagrammatic views of the semiconductor device according to a first embodiment of the present invention.
Figure 1B:
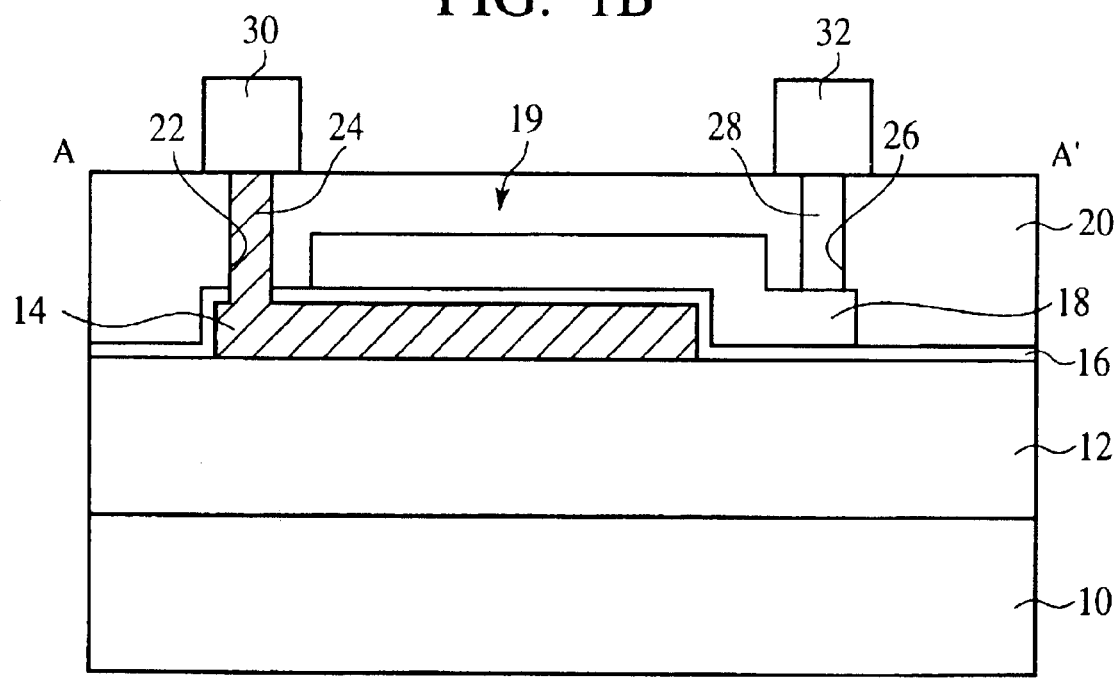

The semiconductor device according to a first embodiment of the present invention and a method for fabricating the semiconductor device will be explained with reference to FIGS. 1A to 3C. FIGS. 1A and 1B are diagrammatic views of the semiconductor device according to the present embodiment. FIG. 1A is a plan view, and FIG. 1B is a sectional view. FIG. 1B is the sectional view along the line A–A'. FIGS. 2A to 3C are sectional views of the semiconductor device according to the present embodiment in the steps of the method for fabricating the semiconductor device, which show the method.

The Semiconductor Device

First, the semiconductor device according to the present embodiment will be explained with reference to FIGS. 1A and 1B.

As shown in FIGS. 1A and 1B, an insulation film 12 of, e.g., 200–500 nm-thickness $SiO_2$ is formed on a semiconductor substrate 10 of, e.g., Si.

A lower electrode 14 of a 200 nm-thickness is formed on the insulation film 12. The lower electrode 14 is formed by polysilicon-aluminum substitute (PAS). The lower electrode 14 is formed of an Al layer which is the metal substituted layer.

The polysilicon-aluminum substitute is a method for contacting electrodes, etc. of polysilicon, etc. with aluminum and subjecting the electrodes, etc. of polysilicon, etc. to heat processing, etc. to convert (substitute) the polysilicon, etc. of the electrodes, etc. to (with) aluminum. About the polysilicon-aluminum substitute, refer to the specification of Japanese Patent Laid-Open Publication No. Hei 11-97535/1999. The polysilicon-aluminum substitute is described also in International Electron Devices Meeting 96, p. 946–948. The polysilicon-aluminum substitute is published in the VLSI symposium, June, 1999 (refer to 1999 Symposium on VLSI Technology 4A-2, p. 35–36).

In the specification of the present application, the metal substituted layer means a metal layer formed by substituting a semiconductor layer, etc. with a metal.

A capacitor dielectric film 16 of, e.g., a 20 nm-thickness is formed on the insulation film 12 with the lower electrode 14 formed on. A material of the capacitor dielectric film 16 can be, e.g., $Ta_2O_5$, SiN, SiON, BST, STO, PZT or others.

An upper electrode 18 is formed of a 200 nm-thickness Al film on the capacitor dielectric film 16, opposed to the lower electrode 14.

The lower electrode 14, the capacitor dielectric film 16 and the upper electrode 18 constitute a capacitor 19.

An inter-layer insulation film 20 of, e.g., a 300 nm-thickness $SiO_2$ film is formed on the capacitor dielectric film 16 with the upper electrode 18 formed on.

An opening 22 is formed in the inter-layer insulation film 20 and the capacitor dielectric film 16 down to the lower electrode 14.

A conductor plug 24 of Al is buried in the opening 22. The Al layer forming the conductor plug 24 is one and the same Al layer that has been used in substituting the polysilicon with aluminum, and the lower electrode 14 and the conductor plug 24 are formed of one and the same aluminum layer integrally with each other.

An opening 26 is formed in the inter-layer insulation film 20 down to the upper electrode 18.

A conductor plug 28 of, e.g., W/TiN/Ti is buried in the opening 26.

On the inter-layer insulation film 20 with the conductor plug 28 buried in, an electrode pad 30 connected to the conductor plug 24, and an electrode pad 32 connected to the conductor plug 28 are formed.

Thus, the semiconductor device according to the present embodiment is constituted.

The semiconductor device according to the present embodiment is characterized mainly in that the lower electrode is formed of the metal substituted layer of Al.

In the conventional semiconductor devices, the lower electrodes are formed of materials which can withstand heat processing of high temperatures for improving film quality of the capacitor dielectric films. Specifically, materials of the lower electrodes have been semiconductors, such as polysilicon, etc. However, semiconductors, such as polysilicon, etc., whose resistivities are high in comparison with those of metals, such as Al, etc., cannot form capacitors of good high-speed response.

In contrast to this, in the present embodiment, the lower electrode is formed of the metal substituted layer. As will be described later, in the present embodiment, the lower electrode of a polysilicon layer is formed, and heat processing of high temperatures for improving film quality of the capacitor dielectric film is performed, and then the polysilicon is substituted with aluminum, which permits aluminum, which cannot withstand the high temperature heat processing, to be used as a material of the lower electrode. Thus, the semiconductor device according to the present embodiment can have good high-speed response.

The Method for Fabricating the Semiconductor Device

Next, the method for fabricating the semiconductor device according to the present embodiment will be explained with reference to FIGS. 2A to 3C.

Figure 2A:
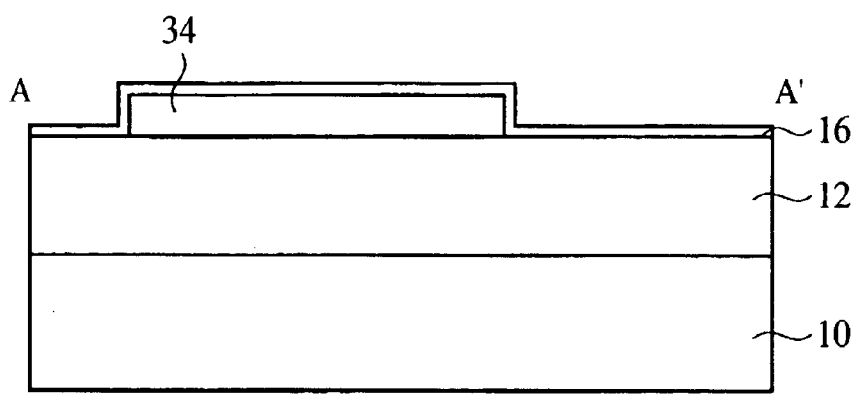
FIGS. 2A to 2C are sectional views of the semiconductor device according to the first embodiment in the steps of the method for fabricating the same, which show the method (Part 1).

First, as shown in FIG. 2A, the insulation film 12 of a 200 nm-thickness $SiO_2$ film is formed on a semiconductor substrate 10 by, e.g., CVD (Chemical Vapor Deposition).

Next, a 200 nm-thickness polysilicon layer is formed on the entire surface by, e.g., CVD.

Then, the polysilicon layer is patterned by photolithography to form the lower electrode 34 of polysilicon.

Next, the capacitor dielectric film 16 is formed of a 20 nm-thickness $Ta_2O_5$, etc. on the entire surface by, e.g., CVD.

Then, heat processing of, e.g., 700° C. is performed for 30 minutes. This heat processing is for improving film quality of the capacitor dielectric film 16.

Figure 2B:
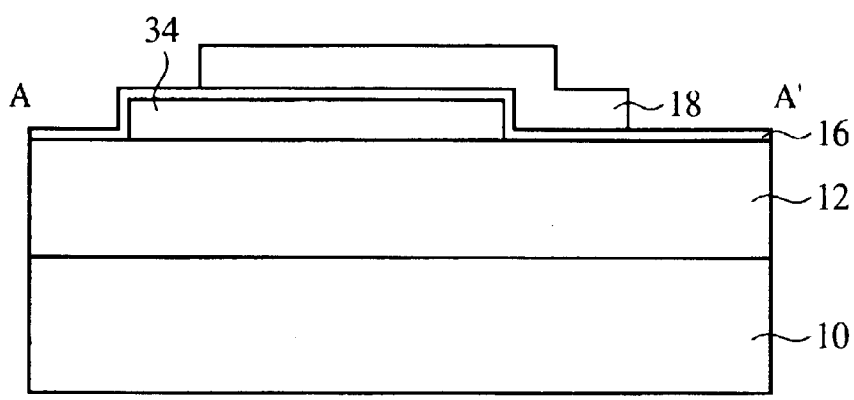

Next, a 200 nm-thickness Al layer is formed on the entire surface by, e.g., CVD or sputtering. Then, the Al layer is patterned by photolithography. Thus, as shown in FIG. 2B, the upper electrodes 18 of the Al layer are formed.

Figure 2C:
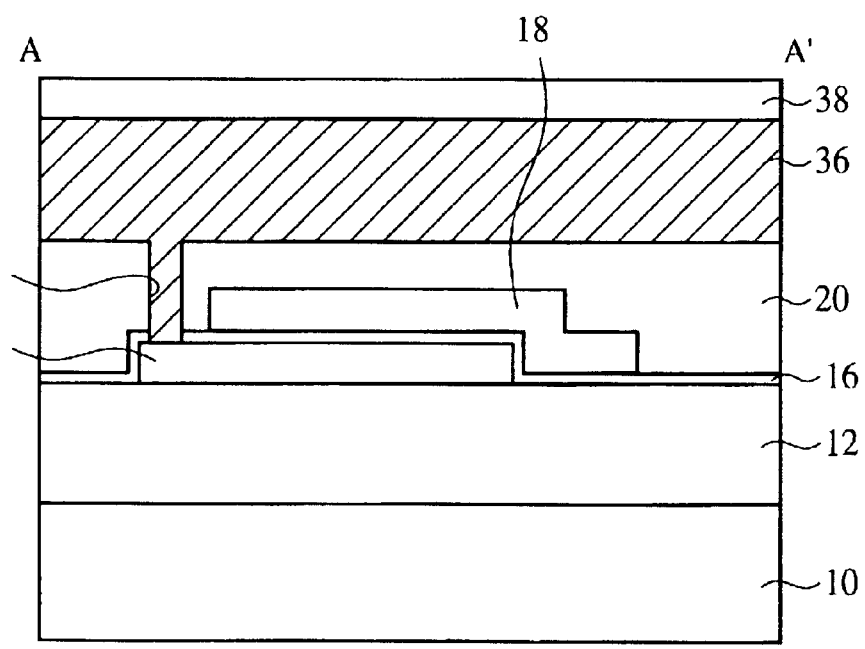

Then, as shown in FIG. 2C, the inter-layer insulation film 20 of a 300 nm-thickness $SiO_2$ film is formed on the entire surface by, e.g., CVD.

Next, the opening 22 is formed in the inter-layer insulation film 20 and the capacitor dielectric film 16 down to the lower electrode 34 of polysilicon.

Then, a 500 nm-thickness Al layer 36 is formed on the entire surface by, e.g., CVD or sputtering. At this time, the Al layer 36 is buried also in the openings 22.

Next, an absorption layer 38 of a 200 nm-thickness Ti film is formed on the entire surface by sputtering. The absorption layer 38 is for absorbing silicon inter-diffused in the Al layer 36 when the polysilicon is substituted with aluminum by the polysilicon-aluminum substitution. The silicon inter-diffused in the Al layer 36 can be absorbed by the absorption layer 38, whereby even when the Al layer 36 is formed thin, the polysilicon can be substituted with the aluminum without failure.

Figure 3A:
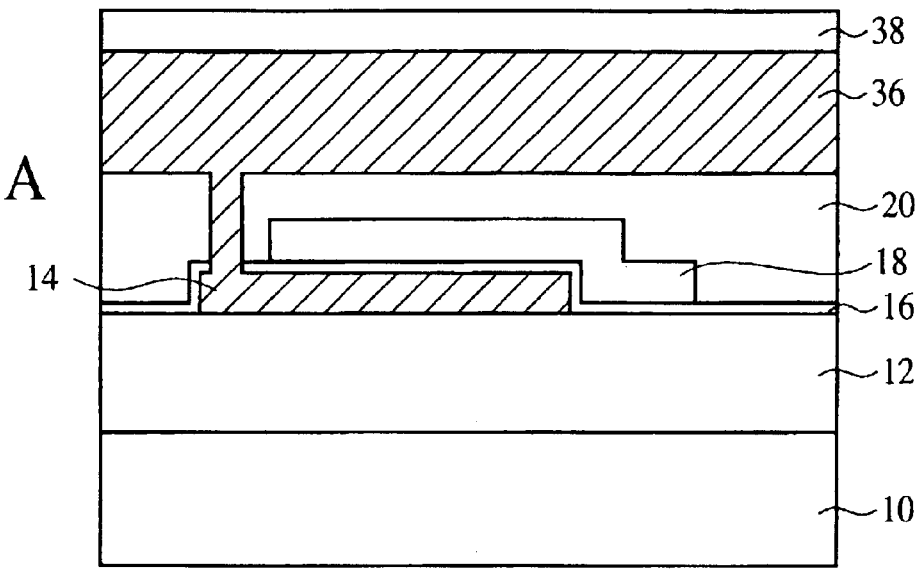
FIGS. 3A to 3C are sectional views of the semiconductor device according to the first embodiment in the steps of the method for fabricating the same, which show the method (Part 2).

Then, as shown in FIG. 3A, heat processing of, e.g., 350–550° C. is performed for about 30 minutes. This heat processing is for substituting the lower electrodes 34 of polysilicon with Al by the polysilicon-aluminum substitution. Thus, the lower electrode 34 of polysilicon is substituted with Al, and the lower electrode 14 of Al is formed.

Thus, the capacitor 19 including the lower electrodes 14, the capacitor dielectric film 16 and the upper electrode 18 is formed.

Figure 3B:
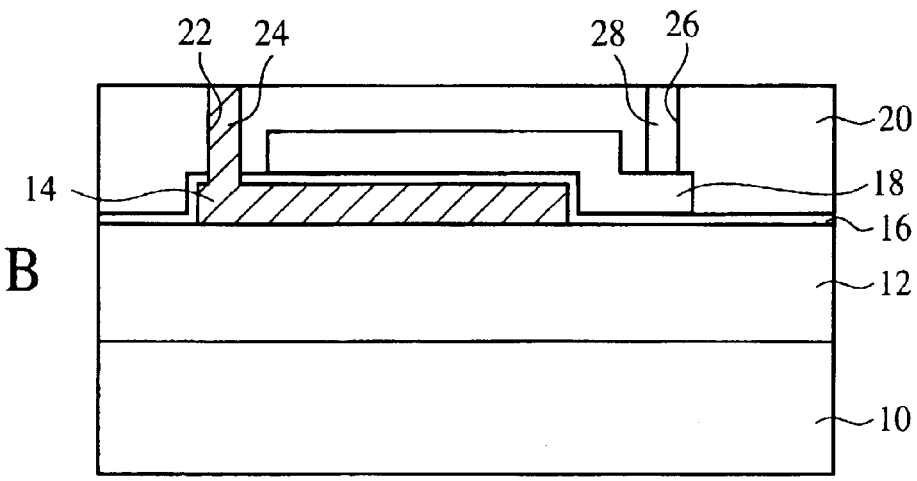
Figure 3C:
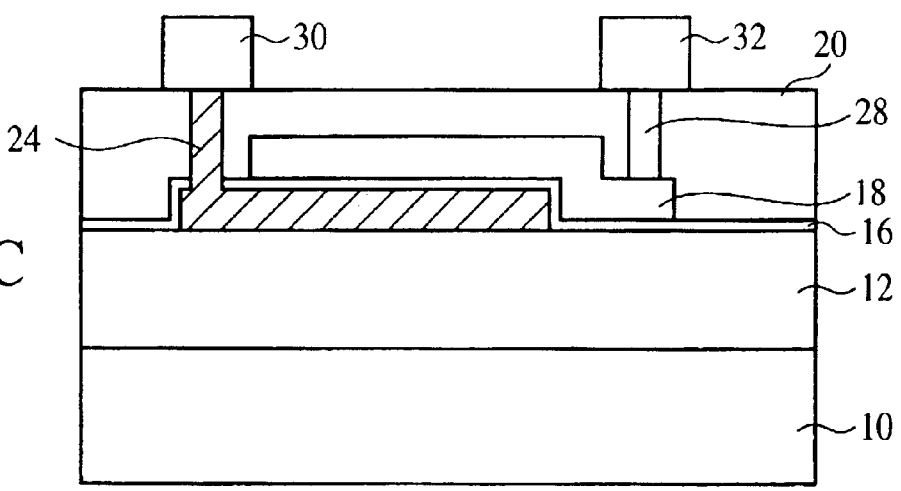

Then, as shown in FIG. 3B, the Al layer 36 is polished by, e.g., CMP (Chemical Mechanical Polishing) until the upper surface of the inter-layer insulation film 20 is exposed. CMP is used here, but CMP is not essential, and etching-back, for example, may be used.

Thus, the conductor plug 24 of Al is buried in the opening 22. The Al layer forming the conductor plug 24 is formed of one and the same Al layer 36 used in substituting the lower electrode 34 of polysiliocn with aluminum, and the lower electrode 14 and the conductor plug 24 are formed of the one and the same Al layer.

In the present embodiment, the lower electrode 14 is formed of the metal substituted layer formed by inter-diffusing aluminum and silicon, and often a concentration gradient of the silicon, which is a semiconductor constituent atom to be substituted, is present from the lower electrode 14 toward the conductor plug 24.

Then, the opening 26 is formed in the inter-layer insulation film 20 down to the upper electrode 18.

Next, the conductor plug 28 of, e.g., W/TiN/Ti is buried in the opening 26.

Then, a 500 mm-thickness Al layer is formed on the entire surface by, e.g., sputtering. Then, the Al layer is patterned by photolithography to thereby form the electrode pads 30, 32 of Al respectively connected to the conductor plugs 24, 28.

Thus, the semiconductor device according to the present embodiment is fabricated.

As described above, according to the present embodiment, the lower electrode 34 of polysilicon is formed, and after the high-temperature heat processing for improving film quality of the capacitor dielectric film 16 is performed, the lower electrode 34 of polysilicon is substituted with aluminum to thereby form the lower electrode 14 of aluminum. This permits aluminum, which cannot withstand the heat processing for improving film quality of the capacitor dielectric film 16, to be used as a material of the lower electrode 14. Thus, according to the present embodiment, the capacitor can have good high-speed response.

According to the present embodiment, polysilicon, which has been used as a material of the lower electrode of the capacitor, may be substituted with aluminum, whereby the capacitor can have the high-speed response improved without large-scale design changes, layout changes, process changes, etc. Thus, according to the present embodiment, development costs and fabrication costs can be depressed, which makes the semiconductor device accordingly inexpensive.

A Second Embodiment

Figure 4A:
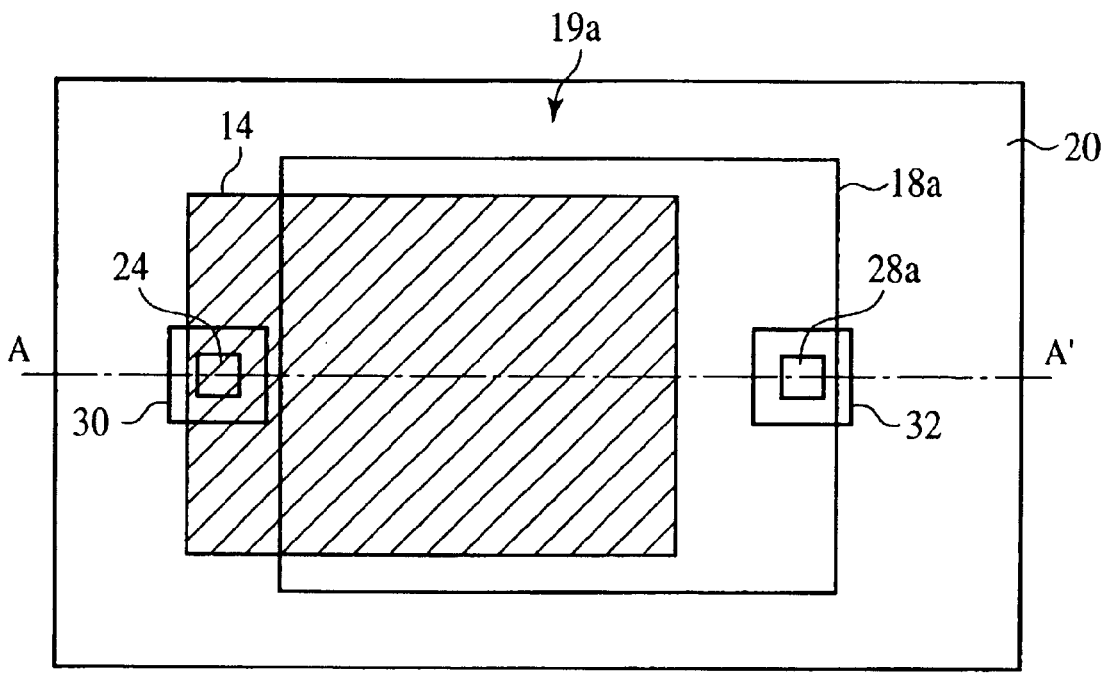
FIGS. 4A and 4B are diagrammatic views of the semiconductor device according to a second embodiment of the present invention.
Figure 4B:
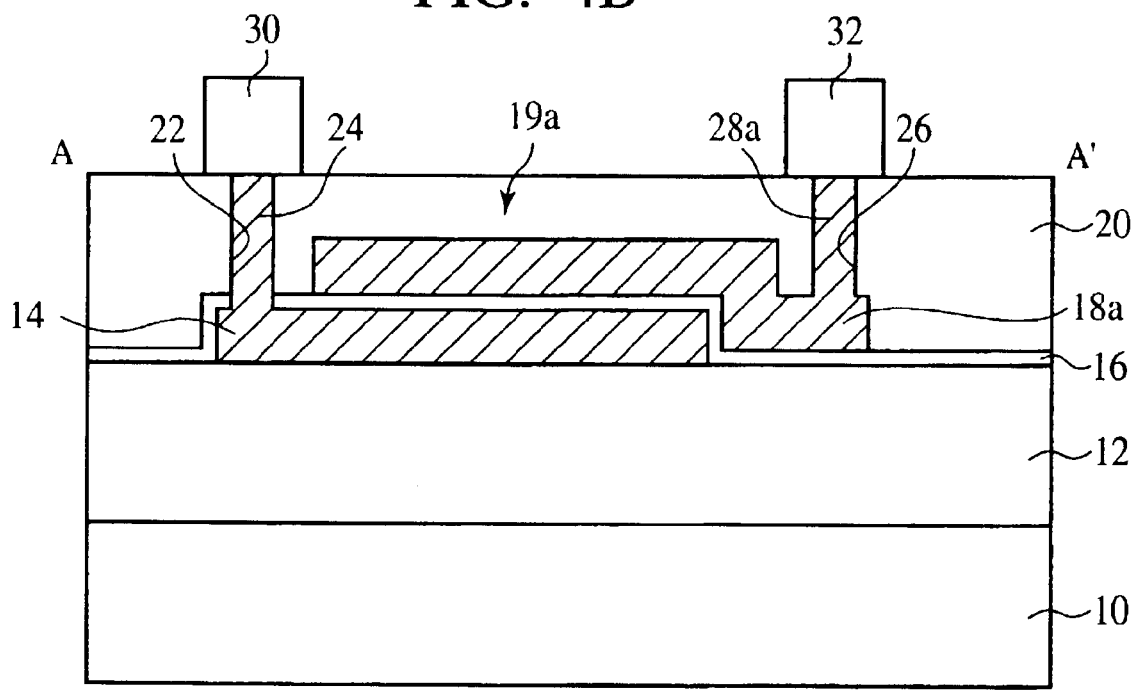

The semiconductor device according to a second embodiment of the present invention and the method for fabricating the same will be explained with reference to FIGS. 4A to 6C. FIGS. 4A and 4B are diagrammatic views of the semiconductor device according to the present embodiment. FIG. 4A is a plan view, and FIG. 4B is a sectional view. FIG. 4B is the sectional view along the line A–A' in FIG. 4A. FIGS. 5A to 6C are sectional views of the semiconductor device according to the present embodiment. The same members of the present embodiment as those of the semiconductor device according to the first embodiment and the method for fabricating the same shown in FIGS. 1A to 3C are represented by the same reference numbers not to repeat or to simplify their explanation.

The Semiconductor Device

First the semiconductor device according to the present embodiment will be explained with reference to FIGS. 4A and 4B.

The semiconductor device according to the present embodiment is characterized mainly in that the lower electrode 14 and upper electrode 18a are both formed of metal substituted layers of Al.

As shown in FIGS. 4A and 4B, the lower electrode 14 of an Al layer which is a metal substituted layer is formed on an insulation layer 12, as in the first embodiment. The lower electrode 14 and a conductor plug 24 are formed of one and the same Al layer integrally with each other.

On the other hand, the upper electrode 18a of an Al layer which is a metal substituted layer is formed on a capacitor dielectric film 16. The upper electrode 18a and a conductor plug 28a are formed of one and the same Al layer integrally with each other.

The lower electrode 14, the capacitor dielectric film 16 and the upper electrode 18a constitute a capacitor 19a.

Thus, the semiconductor device according to the present embodiment is constituted.

As described above, the semiconductor device according to the present embodiment is characterized mainly in that the lower electrode 14 and the upper electrode 18a are formed of metal substituted layers of Al.

In the first embodiment, the lower electrode 14 is formed of the metal substituted layer, but the upper electrode 18 is not formed of a metal substituted layer. Accordingly, in the first embodiment, if the heat processing of high temperature is performed after the upper electrode 18 has been formed, the upper electrode 18 will be dissolved. In the first embodiment, the capacitor having the metal electrodes on a layer formed by a bulk step, where high temperature-heat processing is performed cannot be formed.

In contrast to this, according to the present embodiment, the lower electrode 34 and the upper electrode 40 of polysilicon are formed, and then after the high-temperature heat processing is completed, the lower electrode 34 and the upper electrode 40 of polysilicon have been substituted with Al to form the lower electrode 14 and the upper electrode 18a of Al. Thus, according to the present embodiment, the capacitor having the metal electrode can be formed even on a layer formed by a bulk step, where high-temperature heat processing is performed.

The Method for Fabricating the Semiconductor Device

Next, the method for fabricating the semiconductor device according to the present embodiment will be explained with reference to FIGS. 5A to 6C.

Figure 5A:
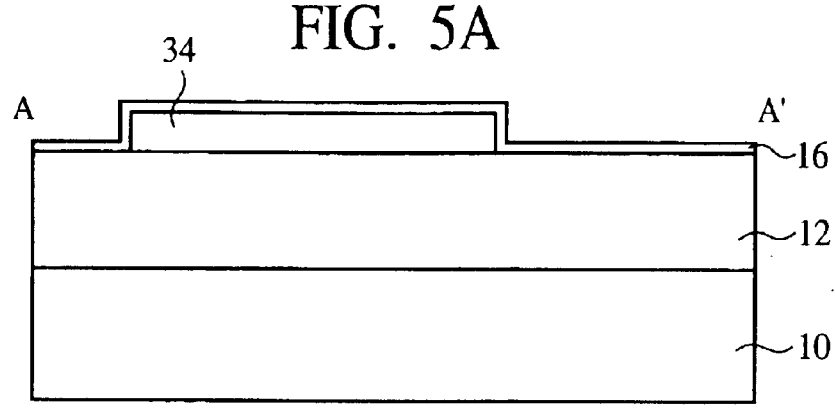
FIGS. 5A to 5C are sectional views of the semiconductor device according to the second embodiment of the present invention in the steps of the method, for fabricating the semiconductor device, which show the method (Part 1).

The steps up to the step of improving film quality of the capacitor dielectric film 16 by the heat processing including the heat processing step are the same as those of the method for fabricating the semiconductor device described above with reference to FIG. 2A, and their explanation of the steps will not be repeated (FIG. 5A).

Figure 5B:
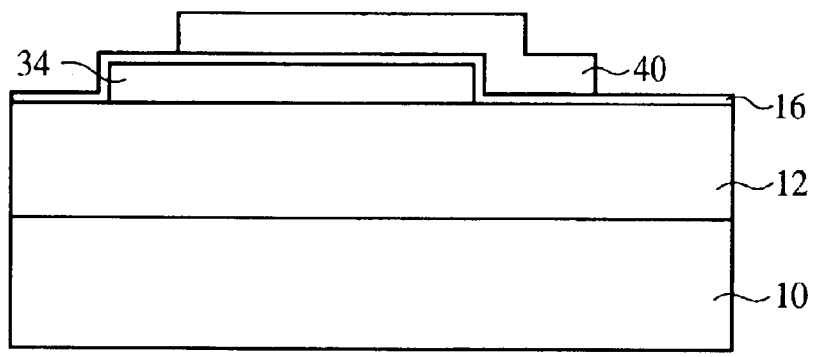

Then, a 200 nm-thickness polysilicon layer is formed on the entire surface by, e.g., CVD. Then, the polysilicon layer is patterned by photolithography. Thus, the upper electrode 40 of polysilicon is formed (FIG. 5B).

Next, in the same way as in the method for fabricating the semiconductor device described above with reference to FIG. 2C, the inter-layer insulation film 20 is formed.

Then, the opening 22 is formed in the inter-layer insulation film 20 and the capacitor dielectric film 16 down to the lower electrode 34 of polysilicon while the opening 26 is formed in the inter-layer insulation film 20 down to the upper electrode 40 of polysilicon.

Figure 5C:
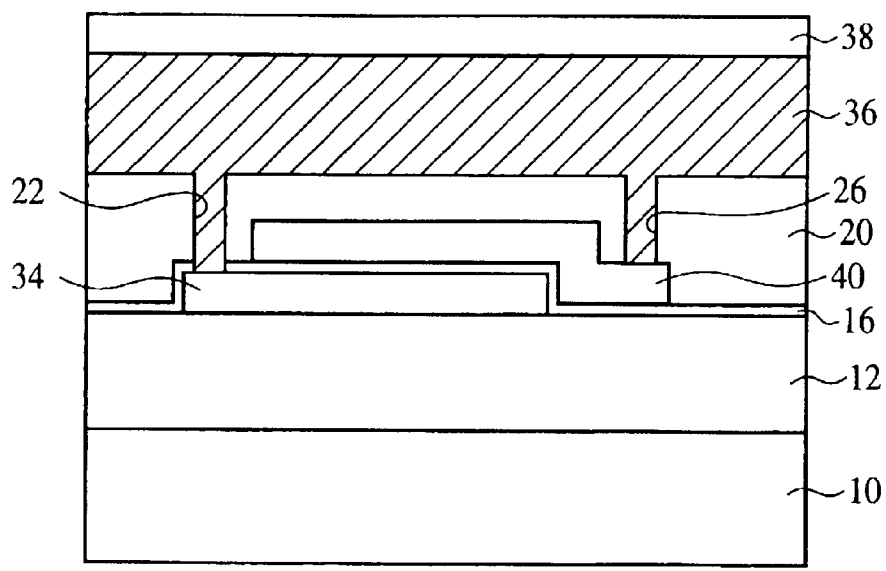

Next, in the same way as in the method for fabricating the semiconductor device described above with reference to FIG. 2C, an Al layer 36 and an absorption layer 38 are formed (FIG. 5C).

Next, in the same way as in the method for fabricating the semiconductor device described above with reference to FIG. 3C, the lower electrode 34 and the upper electrode 40 of polysilicon are substituted with aluminum. Thus, the lower electrode 14 and the upper electrode 18a of the Al layer which is the metal substituted layers are formed.

Figure 6A:
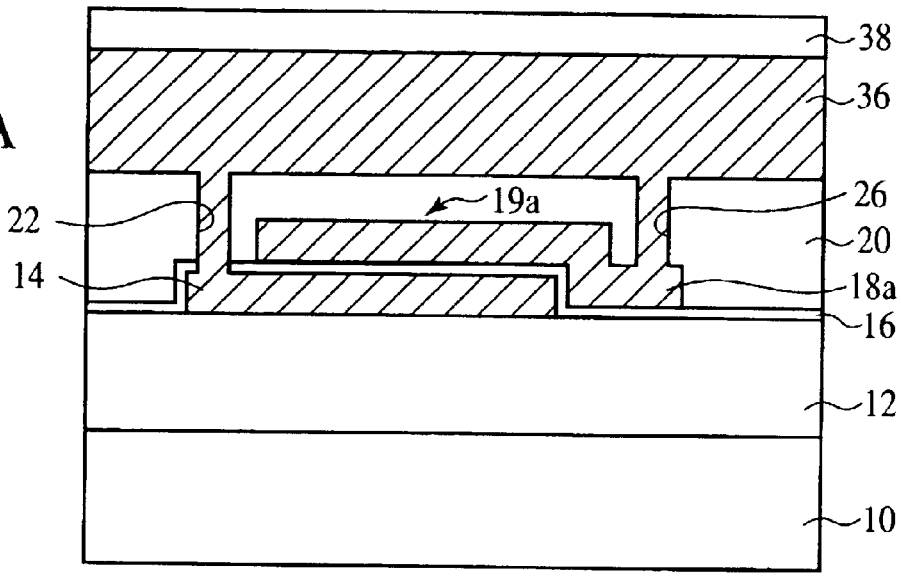
FIGS. 6A to 6C are sectional views of the semiconductor device according to the second embodiment of the present invention in the steps of the method for fabricating the semiconductor device, which show the method (Part 2).
Figure 6B:
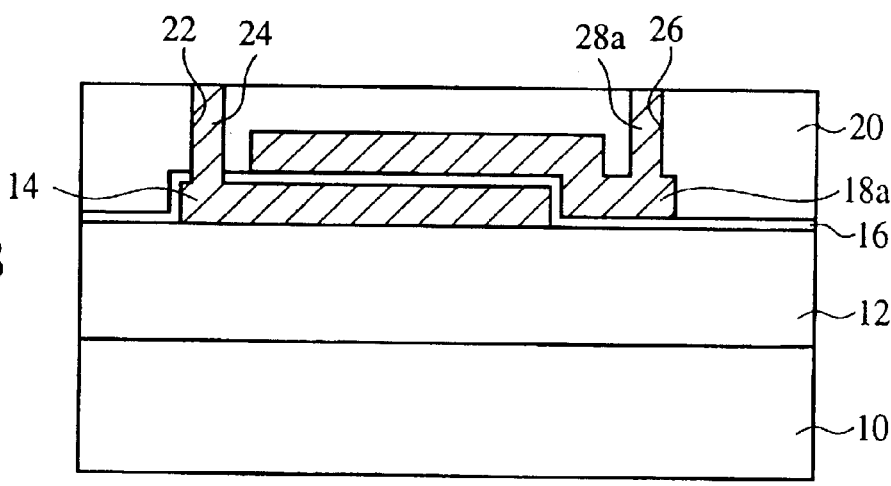
Figure 6C:
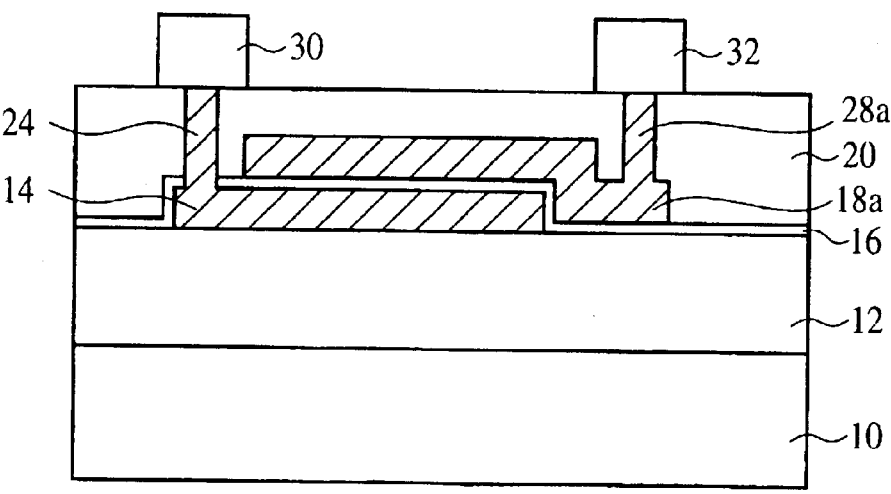

Thus, the capacitor 19a comprising the lower electrode 14, the capacitor dielectric film 16 and the upper electrode 18a is formed (FIG. 6A).

Next, the absorption layer 38 and the Al layer 36 are polished by, e.g., CMP until the surface of the inter-layer insulation film 20 is exposed. Thus, the conductor plug 24 is buried in the opening 22 while the conductor plug 28a is buried in the opening 26. The Al layer forming the conductor plugs 24, 28a is the Al layer used in substituting the polysilicon with the aluminum, whereby the lower electrode 14 and the conductor plug 24 are formed of one and the same Al layer integrally with each other, and the upper electrode 18a and the conductor plug 28a are formed of one and the same Al layer integrally with each other.

The method for fabricating the semiconductor device following the step is the same as that of the method for fabricating the semiconductor device described above with reference to FIG. 3C, and its explanation will not be repeated.

Thus, the semiconductor device according to the present embodiment is fabricated.

According to the present embodiment, the lower electrode 34 and the upper electrode 40 of polysilicon are formed, and the polysilicon is substituted with aluminum, whereby the lower electrode 14 and the upper electrode 18a are formed of Al. Thus, according to the present embodiment, the capacitor including metal electrodes can be formed even on a layer formed by a bulk step, in which high-temperature heat processing is formed.

Modification 1

Figure 7:
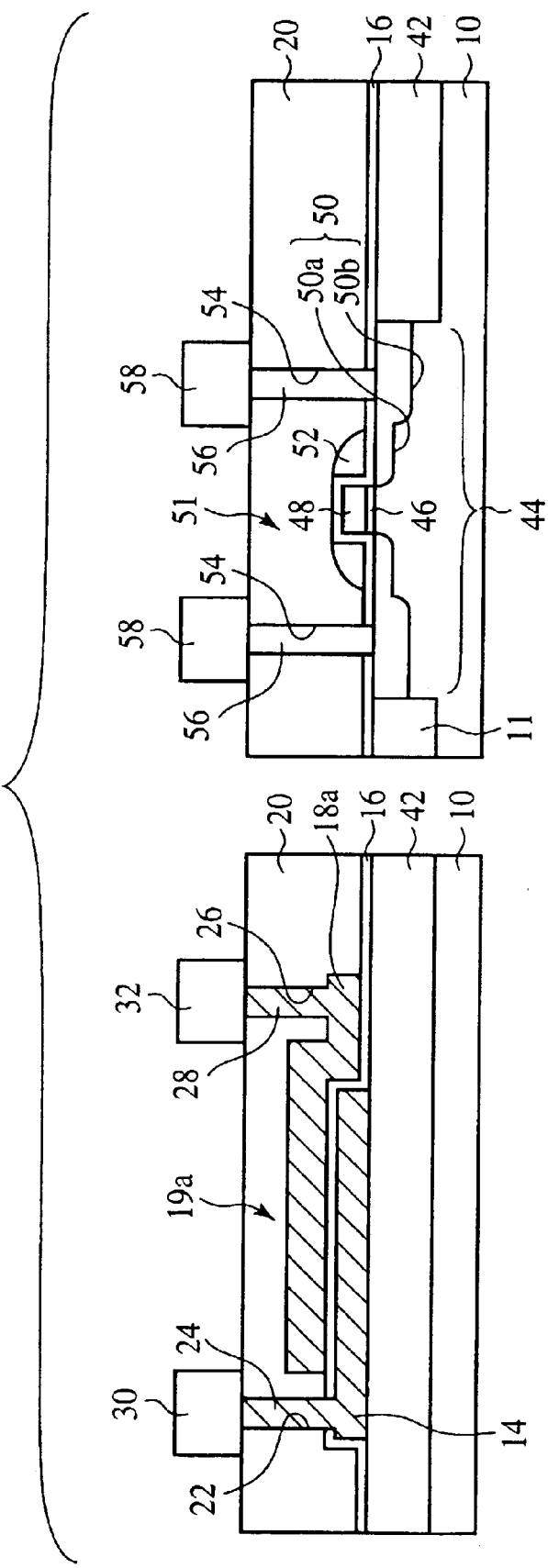
FIG. 7 is sectional views of the semiconductor device according to Modification 1 of the second embodiment of the present invention.

Then, Modification 1 of the semiconductor device according the present embodiment will be explained with reference to FIG. 7. FIG. 7 is sectional views of the semiconductor device according to the present modification.

The semiconductor device according to the present modification is characterized mainly in that the lower electrode 14 of the capacitor 19a is formed on the same layer that the gate electrode of a transistor is formed on.

As shown in FIG. 7, an element isolation region 42 for defining an element region is formed in a semiconductor substrate 10. The element isolation region 42 is formed by, e.g., STI Shallow Trench Isolation).

As shown on the left side of FIG. 7, the lower electrode 14 is formed on the element isolation region 42. The lower electrode 14 is formed of a metal substituted layer of Al.

The upper electrode 18a is formed on the lower electrode 14 with the capacitor dielectric film 16 formed therebetween. The upper electrode 18a is also formed of a metal substituted layer of Al.

The lower electrode 14, the capacitor dielectric film 16 and the upper electrode 18a constitute the capacitor 19a.

On the other hand, as shown on the right side of FIG. 7, the gate electrode 48 is formed in the element region 44 defined by the element isolation region 42 with a gate insulation film 46 formed therebetween.

A dopant diffused region 50a forming a shallow region forming an extension source/drain is formed on the semiconductor substrate 10 on both sides of the gate electrode 48.

A sidewall insulation film 52 of $SiO_2$ is formed on the side wall of the gate electrode 48 having the upper surface and the side wall covered by the capacitor dielectric film 16.

A dopant diffused region 50b forming a deep source drain region is formed on the semiconductor substrate 10 on both sides of the gate electrode 48 with the sidewall insulation film 52 formed on the side wall.

The dopant diffused region 50a and the dopant diffused region 50b constitute a source/drain diffused layer 50.

Thus, a transistor 51 having the gate electrode 48 and the source/drain diffused layer 50 is formed.

Contact holes 54 are formed in the inter-layer insulation film 20 and the capacitor dielectric film 16 down to the dopant diffused regions 50b. The conductor plugs 56 are buried in the contact holes 54.

An interconnection layer 58 is formed on the inter-layer insulation film 20 with the conductor plugs 56 buried in.

Thus, the semiconductor device according to the present modification is constituted.

The semiconductor device according to the present modification is characterized mainly in that the lower electrode 14 of the capacitor 19a is formed on one and the same layer as the gate electrode 48 of the transistor 51 is formed.

In the present modification, the polysilicon layer for forming the lower electrode 34 of polysilicon (see FIG. 5A) is the polysilicon layer to be used in forming the gate electrode 48. In the present modification, the lower electrode 34 and the upper electrode 40 of polysilicon are substituted with Al after the high-temperature heat processing has been completed to thereby form the lower electrode 14 and the upper electrode 18a of Al. Thus, the lower electrode 14 may be formed on one and the same layer as the gate electrode 48 of the transistor 51.

The gate electrode 48 may be substituted with Al when the lower electrode 34 and the upper electrode 40 are substituted with Al.

Modification 2

Figure 8:
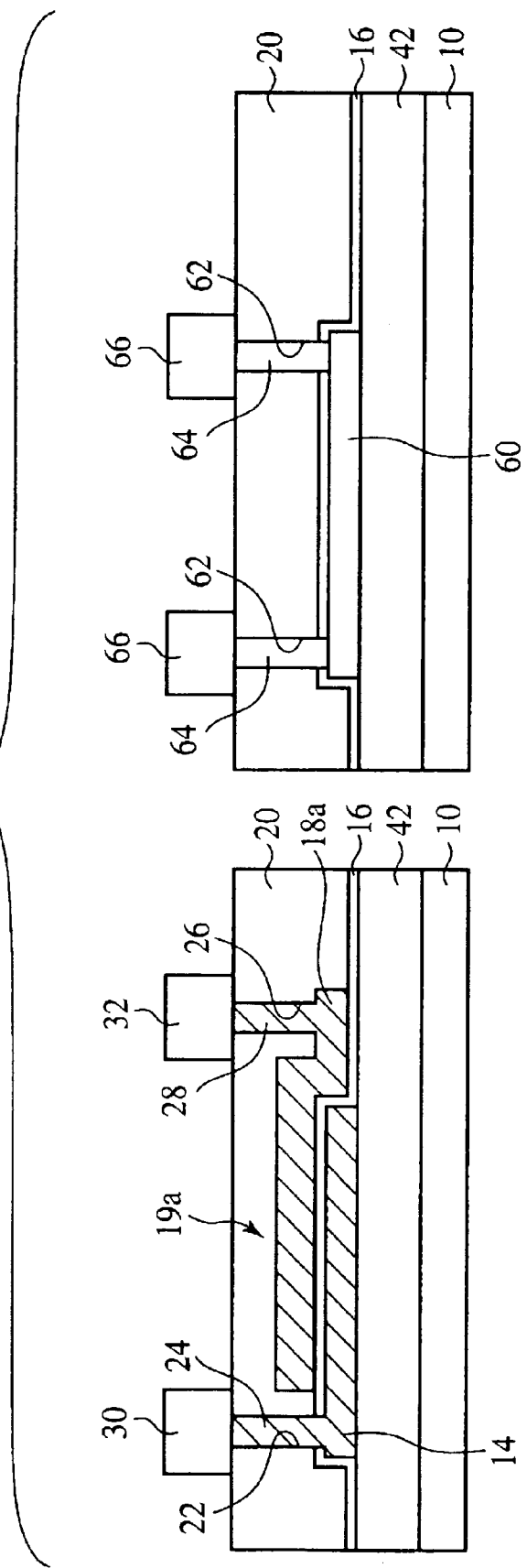
FIG. 8 is sectional views of the semiconductor device according to Modification 2 of the second embodiment of the present invention.

Next, Modification 2 of the semiconductor device according to the present embodiment will be explained with reference to FIG. 8. FIG. 8 is sectional views of the semiconductor device according to the present modification.

The semiconductor device according to the present modification is characterized mainly in that the lower electrode 14 of the capacitor 19a is formed on the same layer as a resistor 60.

The view on the left side of FIG. 8 is the same as that on the left side of FIG. 7, and its explanation will not be repeated.

As shown in the view on the right side of FIG. 8, the resistor 60 of polysilicon is formed on an element isolation region 42.

Contact holes 62 are formed in the inter-layer insulation film 20 and the capacitor dielectric film 16 down to the resistor 60. Conductor plugs 64 are buried in the contact holes 60.

An interconnection layer 66 is formed on the inter-layer insulation film 20 with the conductor plugs 64 buried in.

Thus, the semiconductor device according to the present modification is constituted.

The semiconductor device according to the present modification is characterized mainly in that the lower electrode 14 of the capacitor 19a is formed on the same layer as the resistor 60.

In the present modification, the polysilicon layer forming the lower electrode 34 of polysilicon (see FIG. 5A) is the polysilicon for forming the resistor 60. In the present modification, the lower electrodes 34 and the upper electrode 40 of polysilicon (see FIG. 5B) are substituted with aluminum after the high-temperature heat processing has been completed, to thereby form the lower electrode 14 and the upper electrode 18a of Al. Thus, the lower electrode 14 may be formed on the same layer as the resistor 60.

Modification 3

Figure 9A:
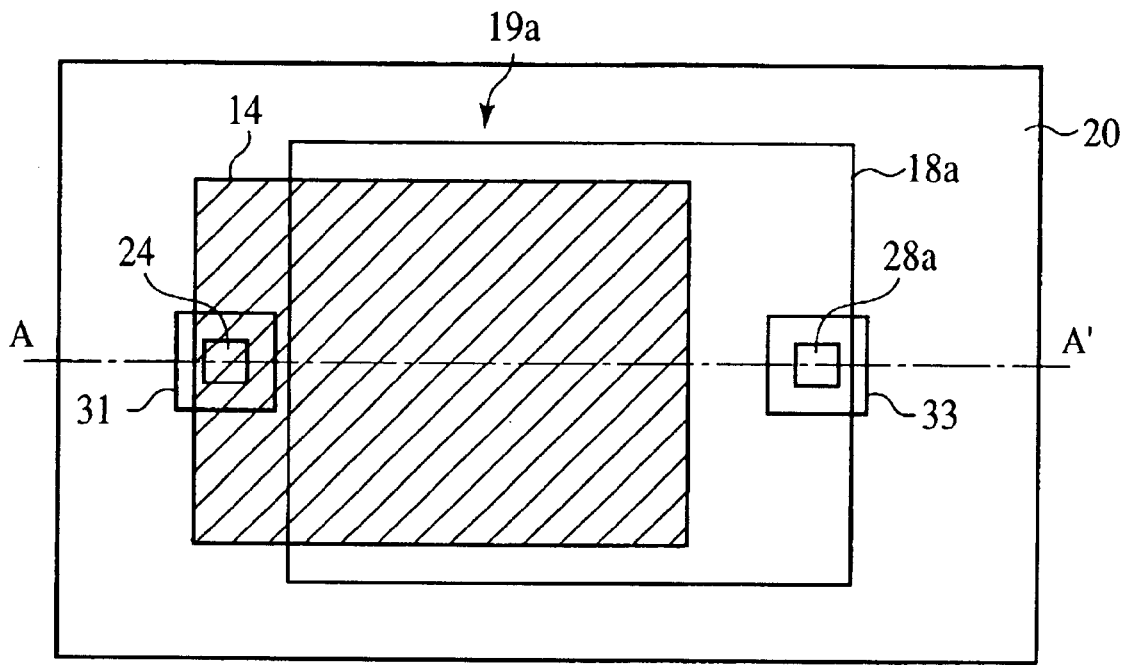
FIGS. 9A and 9B are sectional views of the semiconductor device according to Modification 3 of the second embodiment of the present invention.
Figure 9B:
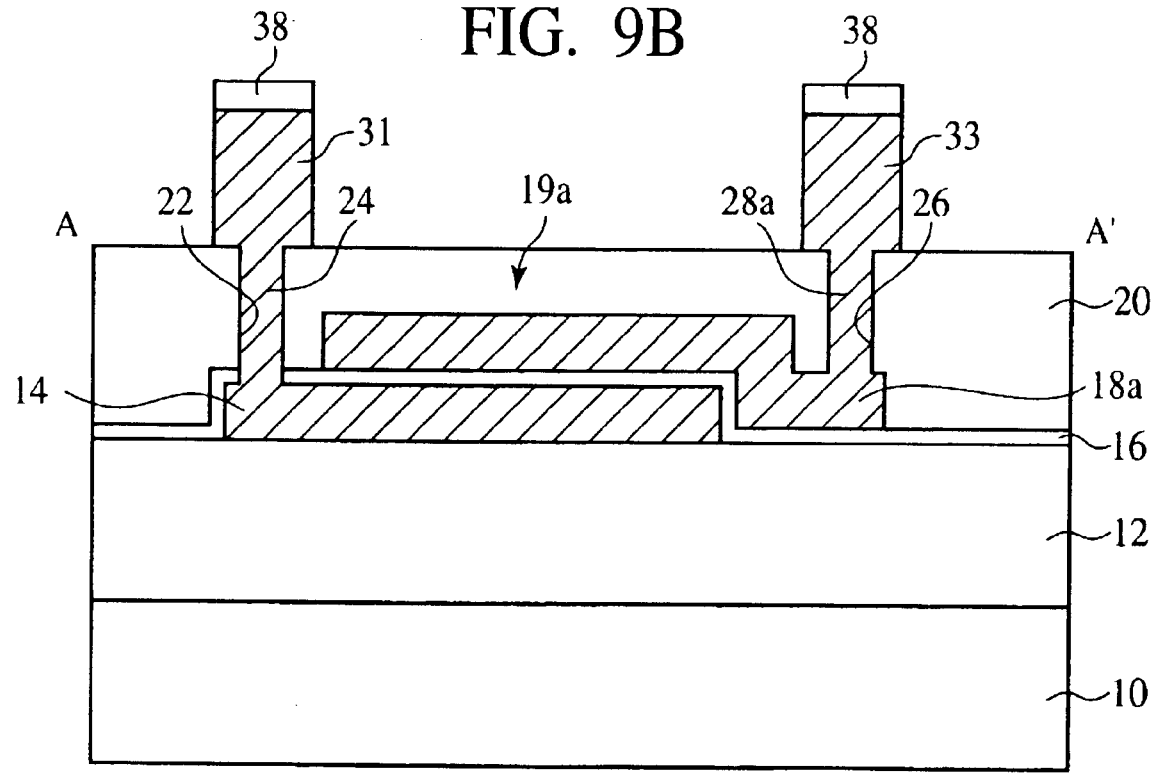
Figure 10A:
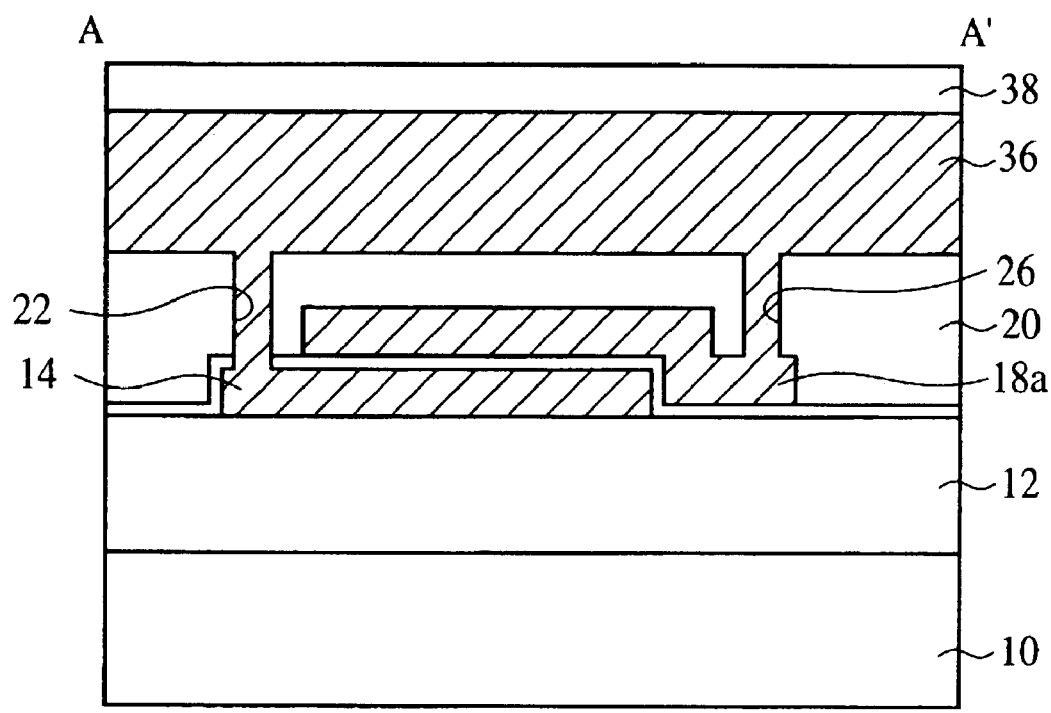
FIGS. 10A and 10B are sectional views of the semiconductor device according to Modification 3 of the second embodiment of the present invention in the steps of the method for fabricating the semiconductor device, which show the method.
Figure 10B:
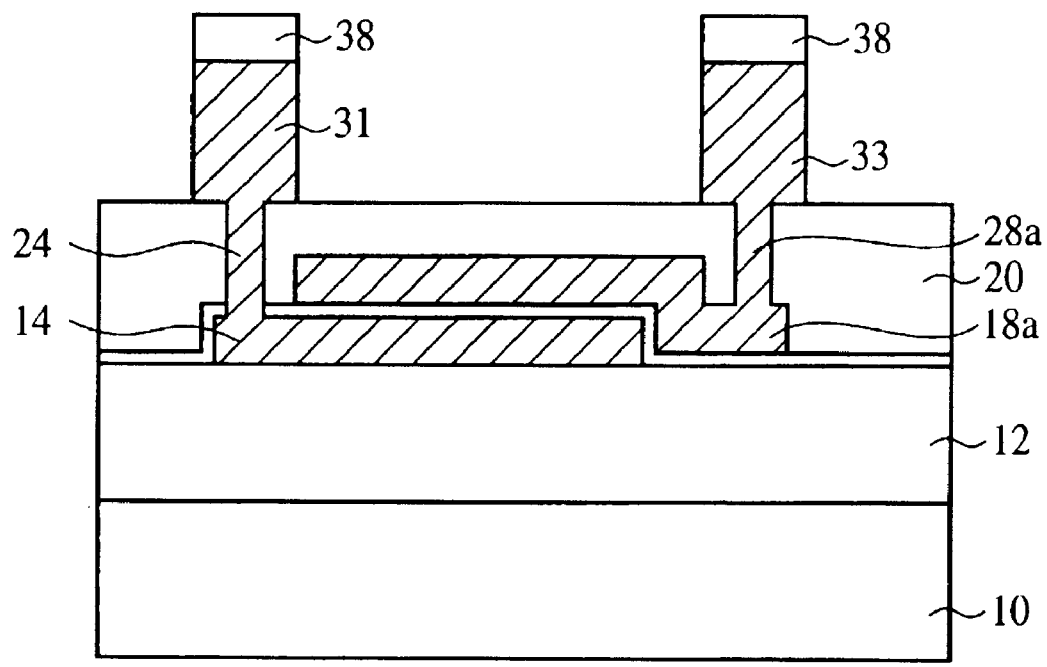

Next, Modification 3 of the semiconductor device according to the present embodiment and the method for fabricating the semiconductor device according to Modification 3 will be explained with reference to FIGS. 9A to 10B. FIG. 9A is plan views of the semiconductor device according to the present modification. FIG. 9A is a plan view of the semiconductor device according to the present modification, and FIG. 9B is a sectional view of the semiconductor device according to the present modification. FIGS. 10A and 10B are sectional views of the semiconductor device according to the present modification in the steps of the method for fabricating the semiconductor device.

The semiconductor device according to the present modification is characterized mainly in that interconnection layers 31, 33 are formed of an Al layer 36 used in substituting the lower electrode 34 and the upper electrode 40 of polysilicon (see FIG. 5B) with aluminum.

As shown in FIGS. 9A and 9B, the interconnection layer 31 is formed by patterning the Al layer used in substituting the lower electrode 34 and the upper electrodes 40 of polysilicon with aluminum. The lower electrode 14, the conductor plug 24 and the interconnection layer 31 are formed of one and the same Al layer integrally with one another.

The absorption layer 38 is formed on the interconnection layer 31.

Because the lower electrode 14, the conductor plug 24 and the interconnection layer 31 are formed of the Al layer 36 used in substituting the lower electrode 34 and the upper electrode 40 of polysilicon with aluminum, concentration gradients of silicon which is a substituted semiconductor constituent atom are often present from the lower electrode 14 toward the interconnection layer 31. That is, in the lower electrode 14, the conductor plug 24 and the interconnection layer 31, concentrations of the silicon often increase gradually from the surface of the interconnection layer 31 toward the end of the lower electrode 14.

In other words, in the lower electrode 14, the conductor plug 24 and the interconnection layer 31, concentrations of the Al often decrease gradually from the surface of the interconnection layer 31 toward the end of the lower electrode 14.

A concentration distribution of the Al in the lower electrode 14 and the conductor plug 24 and the interconnection layer 31 is expressed by, e.g., the following formula.

$$\frac{C(x,t)}{C_s} = \mathrm{erfc}\left(\frac{x}{2\sqrt{Dt}}\right) \quad (1)$$

However, $$\mathrm{erfc}(z) = 1 - \frac{2}{\sqrt{\pi}}\int_0^z e^{-y^2}dy \quad (2)$$

wherein x represents a depth (unit: cm) from the surface of the interconnection layer; t, a period of time of the heat processing time (unit: second) by polysilicon-aluminum substitution; D, a diffusion constant (unit: cm$^3$/second); C(x,t), an aluminum concentration (unit: cm$^{-3}$) at a depth x for t hours of the heat-processing; and $C_S$, an Al concentration at the surface of the interconnection layer. The diffusion constant D has various values depending on temperatures of the heat processing, periods of time of the heat processing, etc.

As seen from the above-described formulas, aluminum concentration gradients in the lower electrode 14, the conductor plug 24 and the interconnection layer 31 are, e.g., exponential distributions. In other words, silicon concentration distributions in the lower electrode 14, the conductor plug 24 and the interconnection layer 31 are, e.g., exponential distributions.

Figure 25:
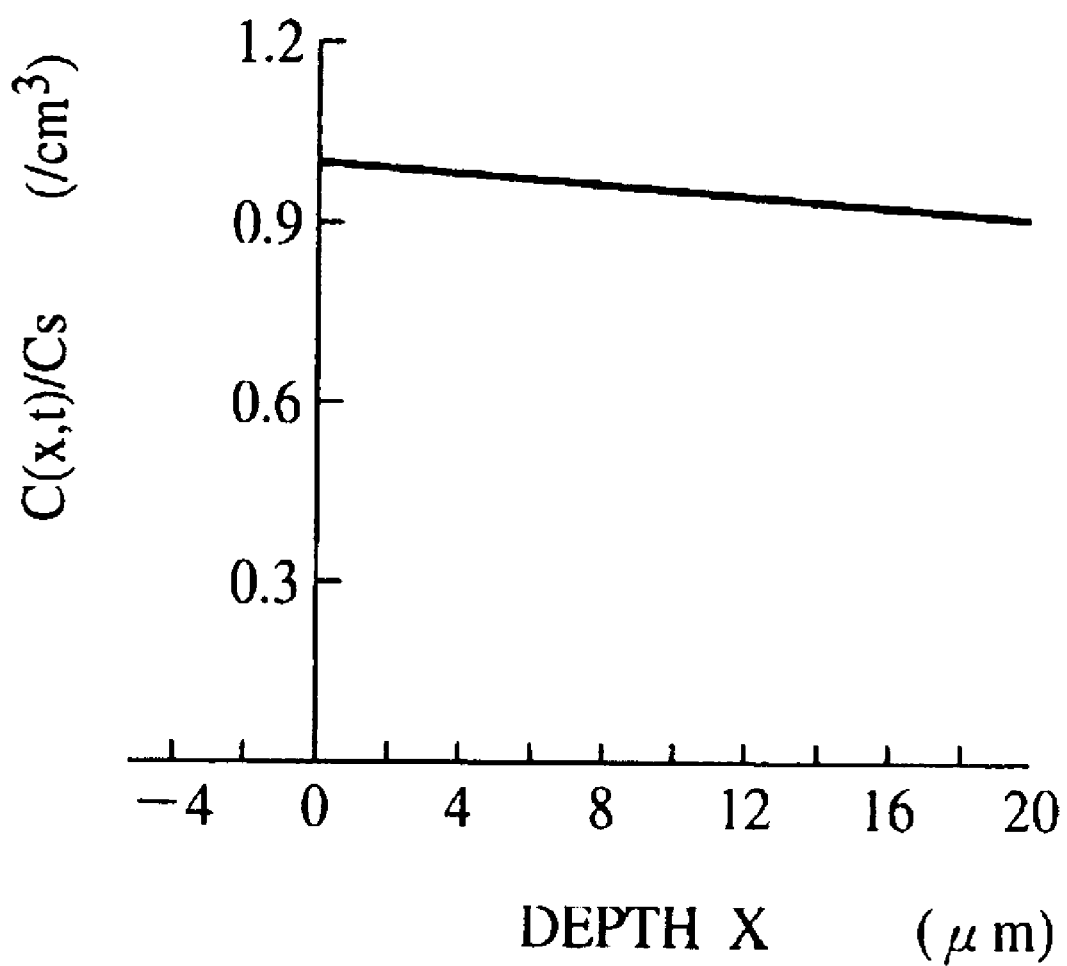
FIG. 25 is a graph of concentration distributions of aluminum.

Based on the above-described formulas, aluminum concentration distributions in the lower electrode 14, the conductor plug 24 and the interconnection layer 31 are as shown in FIG. 25. FIG. 25 is a graph of the aluminum concentration distributions.

On the other hand, the interconnection layer 33 is formed by patterning the Al layer 36 used in substituting the lower electrode 34 and the upper electrode 40 of polysiliocn with aluminum. The upper electrode 18a, the conductor plug 28a and the interconnection layer 33 are formed of one and the same Al layer integrally with one another.

The absorption layer 38 is formed on the interconnection layer 33.

In the present modification, the absorption layer 38 is formed on the interconnection layers 31, 33. However, the interconnection layers 31, 33 may be formed by removing the absorption layer 38 alone and patterning the Al layer 36 alone.

The upper electrode 18a, the conductor plug 28a and the interconnection layer 33 are formed of the Al layer 36 used in substituting the lower electrode 34 and the upper electrode 40 of polysiliocn with aluminum. Accordingly, concentration gradients of silicon which is a substituted semiconductor constituent atom are often present from the upper electrode 18a toward the interconnection layer 33. That is, in the upper electrode 18a, the conductor plug 28a and the interconnection layer 33, concentrations of the silicon often increase gradually from the surface of the interconnection layer 33 toward the end of the upper electrode 18a. In other words, in the upper electrode 18a, the conductor plug 28a and the interconnection layer 33, concentrations of the aluminum often increase gradually from the surface of the interconnection layer 33 toward the end of the upper electrode 18a. As described above, concentration gradients of the aluminum and the silicon are, e.g., exponential distributions.

Thus, the semiconductor device according to the present modification is constituted.

Then, the method for fabricating the semiconductor device according to the present modification will be explained with reference to FIGS. 10A and 10B.

First, the step of substituting the lower electrode 34 and the upper electrode 40 of polysilicon with aluminum to form the lower electrode 14 and the upper electrode 18a of Al including the Al lower electrode 14 and upper electrode 18a step are the same as those of the method for fabricating the semiconductor device described above with reference to FIGS. 5A to 6A, and their explanation will not be repeated (FIG. 10A).

Then, as shown in FIG. 10B, the absorption layer 38 and the Al layer 36 are patterned to form the interconnection layers 31, 33 of Al.

In the present modification, the interconnection layers 31, 33 are formed of the Al layer 36 (see FIG. 10A) used in substituting the lower electrode 34 and the upper electrode 40 of polysilicon with aluminum, which makes it unnecessary to form, in addition to the Al layer 36, another Al layer for forming the interconnection layers 31, 33. According to the present modification, the fabrication process can be simplified.

A Third Embodiment

Figure 11A:
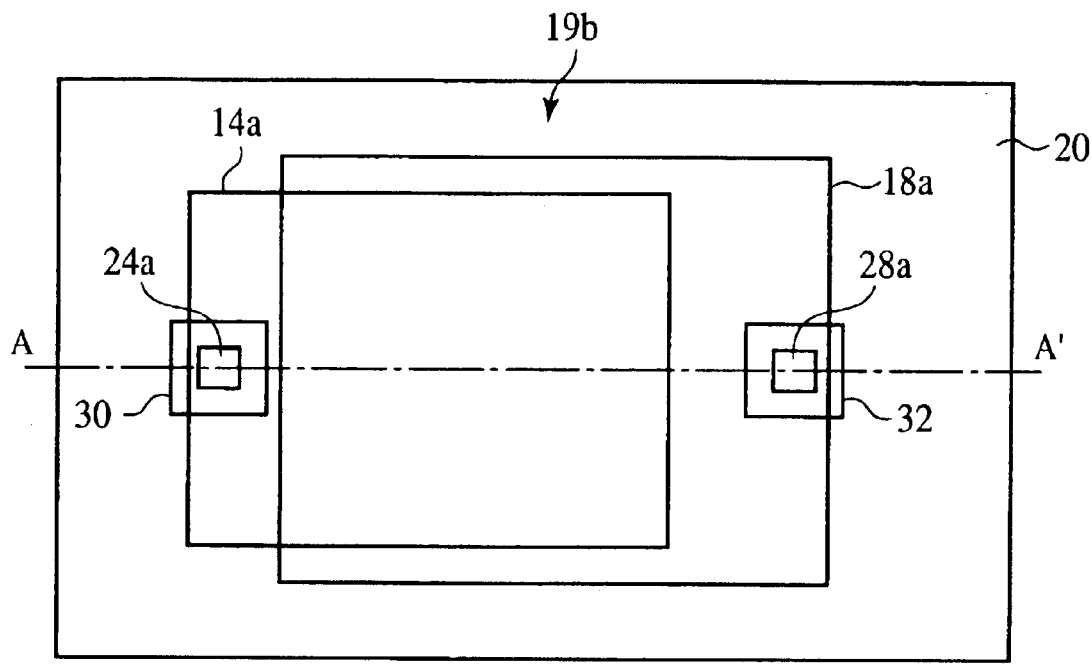
FIGS. 11A and 11B are diagrammatic views of the semiconductor device according to a third embodiment of the present invention.
Figure 11B:
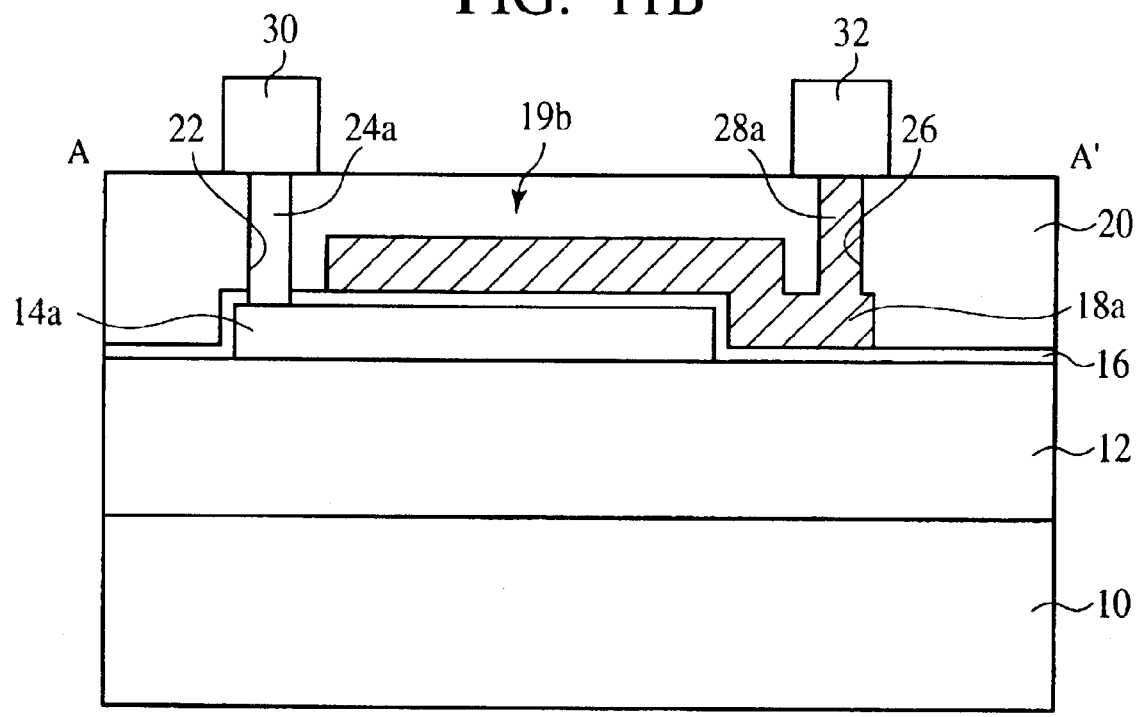

The semiconductor device according to a third embodiment of the present invention and the method for fabricating the semiconductor device will be explained with reference to FIGS. 11A to 13C. FIGS. 11A and 11B are diagrammatic views of the semiconductor device according to the present embodiment. FIG. 11A is a plan view, and FIG. 11B is a sectional view. FIG. 11B is the sectional view along the line A–A'. FIGS. 12A to 13C are sectional views of the semiconductor device according to the present embodiment in the steps of the method for fabricating the same, which show the method. The same members of the present embodiment as those of the semiconductor device according to the first or the second embodiment and the method for fabricating the same shown in FIGS. 1A to 10B are represented by the same reference numbers not to repeat or to simplify their explanation.

A Semiconductor Device

First, the semiconductor device according to the present embodiment will be explained with reference to FIGS. 11A and 11B.

The semiconductor device according to the present embodiment is characterized mainly in that a lower electrode 14a is formed of a polysilicon layer, and an upper electrode 18a is formed of a metal substituted layer of Al.

As shown in FIGS. 11A and 11B, the lower electrode 14a of polysilicon is formed on an insulation film 12.

A conductor plug 24a of, e.g., W/TiN/Ti is buried in an opening 22 formed down to the lower electrode 14a.

On the other hand, the upper electrode 18a of the Al layer which is the metal substituted layer is formed on a capacitor dielectric film 16. The upper electrode 18a and the conductor plug 28a are formed of one and the same Al layer integrally with each other.

The upper electrode 14a, the capacitor dielectric film 16 and the upper electrode 18a constitute a capacitor 19b.

Thus, the semiconductor device according to the present embodiment is constituted.

As described above, the upper electrode 18a alone may be formed of the metal substituted layer of Al.

The Method for Fabricating the Semiconductor Device

Next, the method for fabricating the semiconductor device according to the present embodiment will be explained with reference FIGS. 12A to 13C.

First, in the same way as in the method for fabricating the semiconductor device described above with reference to FIG. 2A, an insulation film 12 is formed.

Next, in the same way as in the method for fabricating the semiconductor device described above with reference to FIG. 2A, a polysilicon layer is formed on the entire surface. Then, the polysilicon layer is patterned by photolithography to form the lower electrode 14a (see FIG. 12A).

The following steps of forming the capacitor dielectric film 16 up to the step of performing heat processing to improve film quality of the capacitor dielectric film 16 including the heat processing step are the same as those of the method for fabricating the semiconductor device described above with reference to FIG. 2A, and their explanation will not be repeated.

Figure 12A:
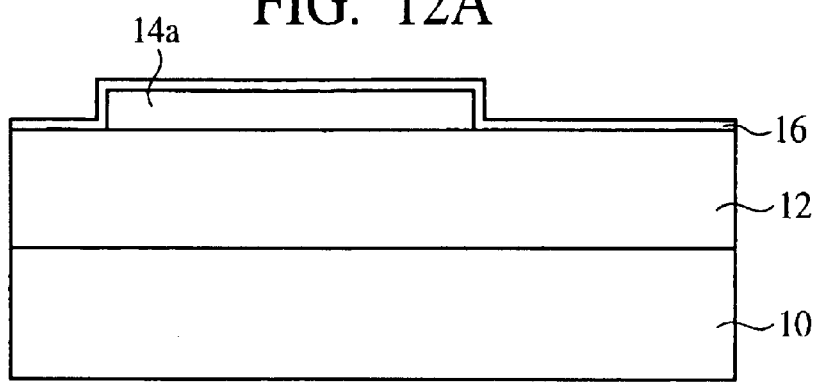
FIGS. 12A to 12C are sectional views of the semiconductor device according to the third embodiment of the present invention in the steps of the method for fabricating the same, which explain the method (Part 1).
Figure 12B:
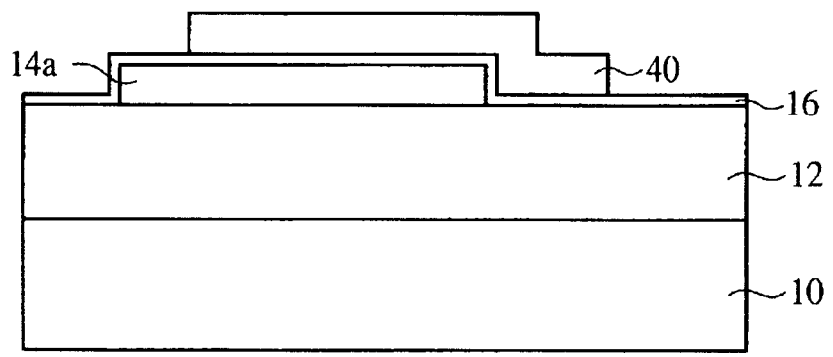

Next, in the same way as in the method for fabricating the semiconductor device described above with reference to FIG. 5B, the upper electrode 40 of polysilicon is formed (FIG. 12B)

Then, in the same was as in the method for fabricating the semiconductor device described above with reference to FIG. 2C, an inter-layer insulation film 20 is formed.

Next, an opening 26 is formed in the inter-layer insulation film 20 down to the upper electrode 40 of polysilicon.

Figure 12C:
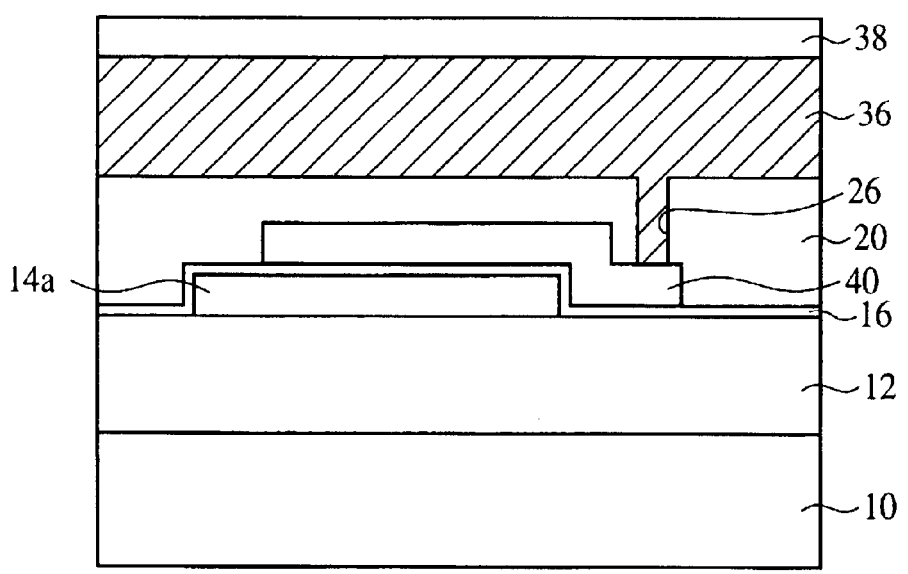

Then, in the same way as in the method for fabricating the semiconductor device described above with reference to FIG. 2C, the Al layer 36 and an absorption layer 38 are formed (FIG. 12C).

Figure 13A:
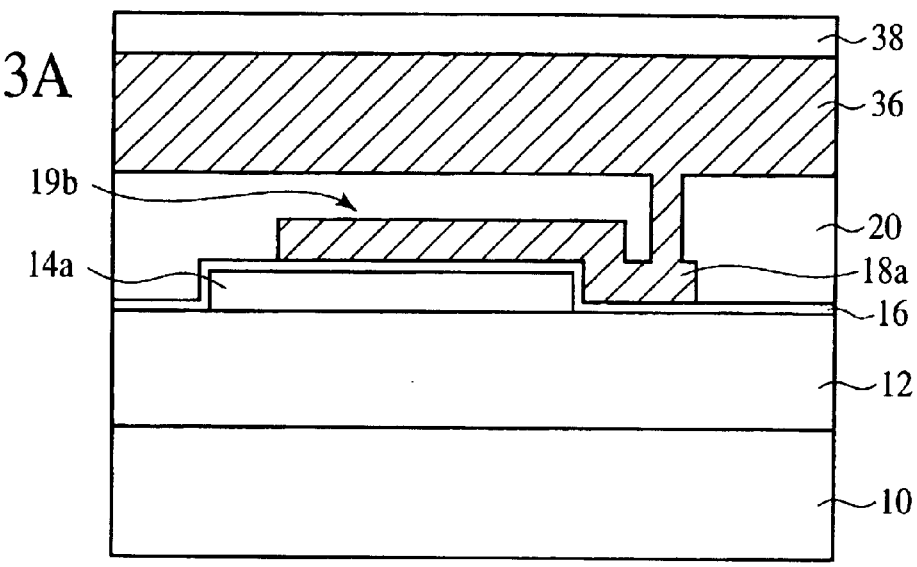
FIGS. 13A to 13C are sectional views of the semiconductor device according to the third embodiment of the present invention in the steps of the method for fabricating the same, which explain the method (Part 2).

Then, in the same way as in the method for fabricating the semiconductor device described above with reference to FIG. 3A, the upper electrode 40 of polysilicon is substituted with Al by polysilicon-aluminum substitution. Thus, the upper electrode 18a of the Al layer, which is the metal substituted layer, is formed. Thus, the capacitor 19b comprising the lower electrode 14a, the capacitor dielectric film 16 and the upper electrode 18a is formed (FIG. 13A).

Next, in the same way as in the method for fabricating the semiconductor device described above with reference to FIG. 3B, the absorption layer 38 and the Al layer 36 are polished until the upper surface of the inter-layer insulation film 20 is exposed. Thus, the conductor plug 28a is buried in the opening 26. The Al layer forming the conductor plug 28a is the Al layer used in substituting the upper electrode 40 of polysilicon with aluminum, which permits the upper electrode 18a and the conductor plug 28a to be formed of one and the same Al layer integrally with each other.

Figure 13B:
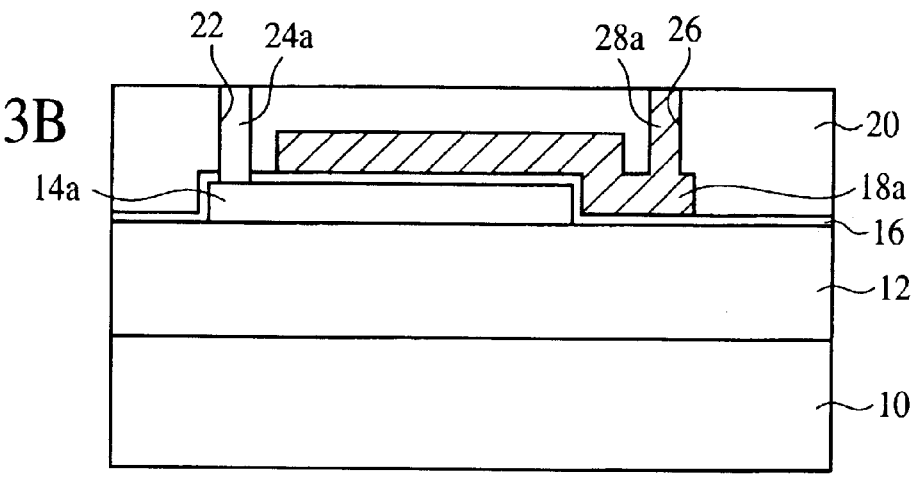

Next, as shown in FIG. 13B, the opening 22 is formed in the inter-layer insulation film 20 and the capacitor dielectric film 16 down to the lower electrode 14a.

Then, the conductor plug 24a of W/TiN/Ti is formed in the opening 22.

Figure 13C:
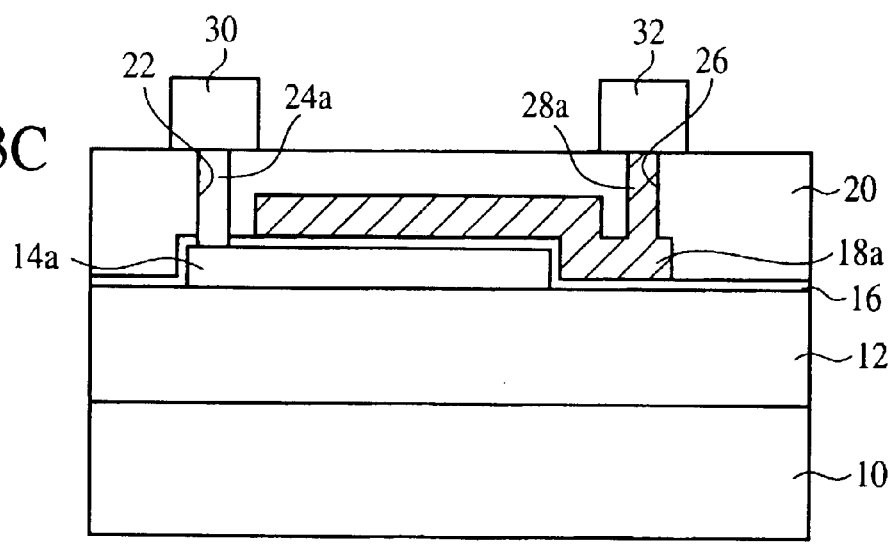

The following steps of the method for fabricating the semiconductor device shown in FIG. 13C are the same as those of the method for fabricating the semiconductor device described above with reference to FIG. 3C, and their explanation will not be repeated.

Thus, the semiconductor device according to the present embodiment is fabricated.

A Fourth Embodiment

Figure 14A:
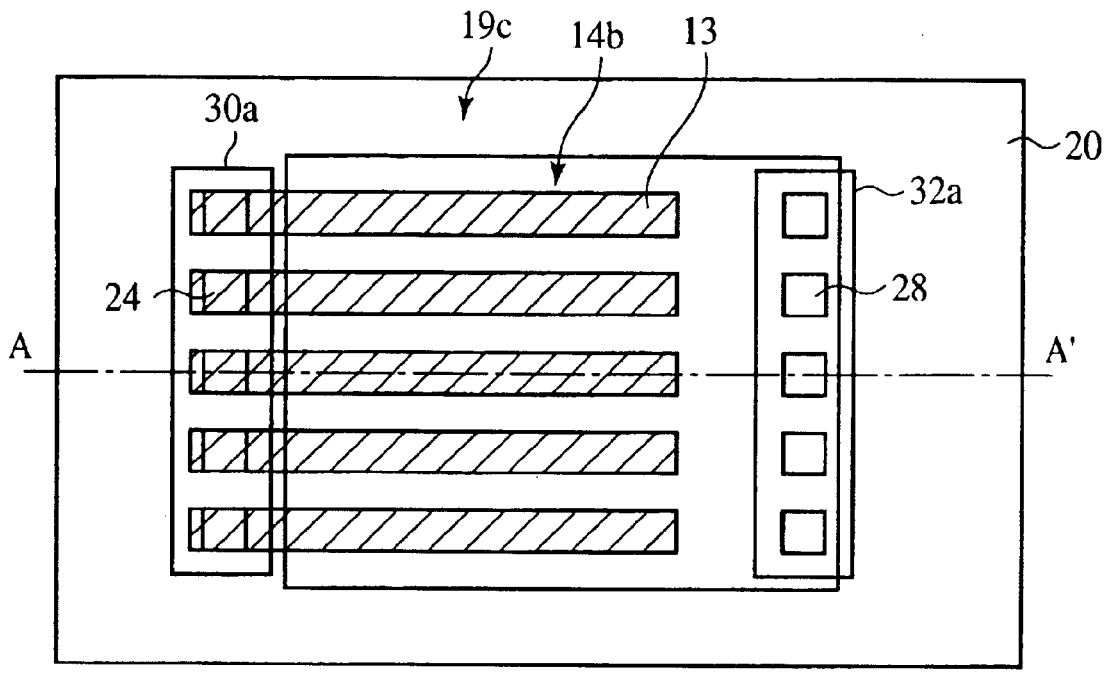
FIGS. 14A and 14B are diagrammatic views of the semiconductor device according to a fourth embodiment of the present invention.
Figure 14B:
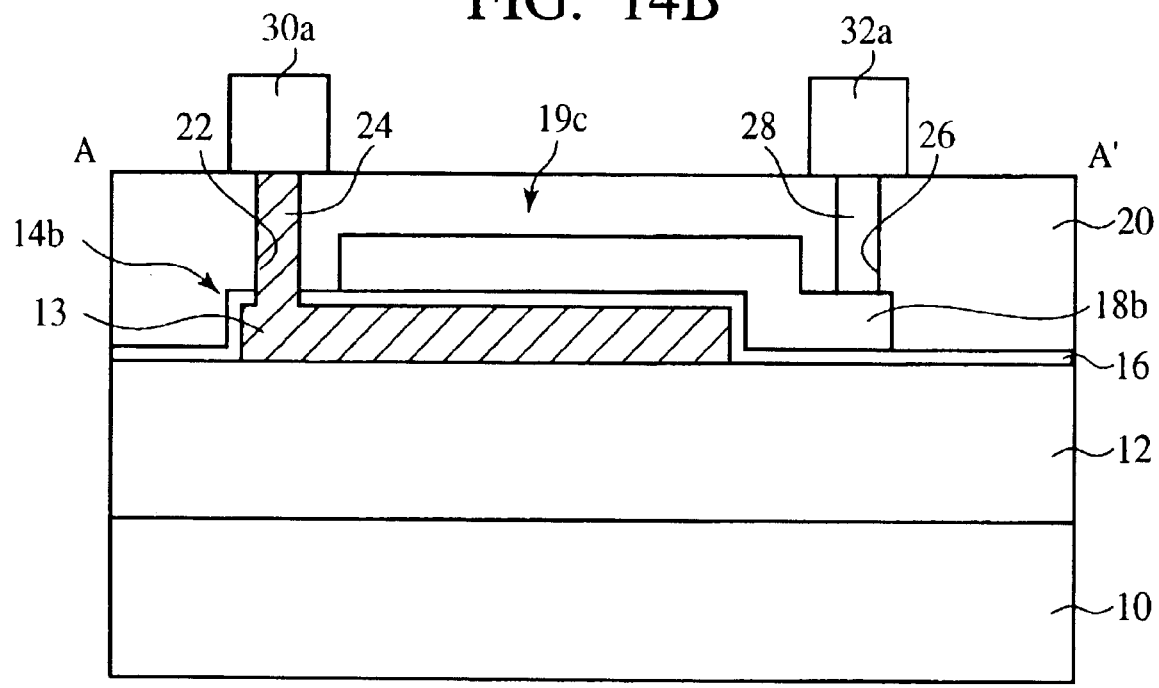

The semiconductor device according to a fourth embodiment of the present invention will be explained with reference to FIGS. 14A to 20B. FIGS. 14A and 14B are diagrammatic views of the semiconductor device according to the present embodiment. FIG. 14A is a plan view, and the FIG. 14B is a sectional view. FIG. 14B is the sectional view along the line A–A'. The same members of the present embodiment as those of the semiconductor device according to the first to the third embodiments shown in FIGS. 1A to 13C are represented by the same reference numbers not to repeat or to simplify their explanation.

The Semiconductor Device

First, the semiconductor device according to the present embodiment will be explained with reference to FIGS. 14A and 14B.

The semiconductor device according to the present embodiment is characterized mainly in that a lower electrode 14b is divided in stripes.

As shown in FIGS. 14A and 14B, a plurality of strip-shaped sectional electrodes 13 are arranged in stripes. The plurality of sectional electrodes 13 form the lower electrode 14b. The sectional electrodes 13 are formed of an Al layer of a metal substituted layer.

A capacitor dielectric film 16 is formed on an insulation film 12 with the lower electrode 14b formed on.

On the capacitor dielectric film 16, an upper electrode 18b of Al is formed, opposed to the lower electrode 14b.

The lower electrode 14b, the capacitor dielectric film 16 and the upper electrode 18b constitute a capacitor 19c.

A plurality of openings 22 are formed in the inter-layer insulation film 20 and the capacitor dielectric film 16 down to the sectional electrodes 13.

Conductor plugs 24 are buried respectively in the openings 22. The Al layer forming the conductor plugs 24 are the Al layer used in substituting the polysilicon with the aluminum, which permits the sectional electrodes 13 and the conductor plugs 24 to be formed of one and the same Al layer.

A plurality of openings 26 are formed in the inter-layer insulation film 20 down to the upper electrode 18b. Conductor plugs 28 are buried in the openings 26.

Electrode pads 30a, 32a are formed on the inter-layer insulation film 20 with the conductor plugs 24, 28 buried in. The electrodes pads 30a are connected to the plurality of conductor plugs 24 buried in the inter-layer insulation film 20. The electrode pads 32a are connected to the plurality of conductor plugs 28 buried in the inter-layer insulation film 20.

Thus, the semiconductor device according to the present embodiment is constituted.

The Method for Fabricating the Semiconductor Device

Figure 15A:
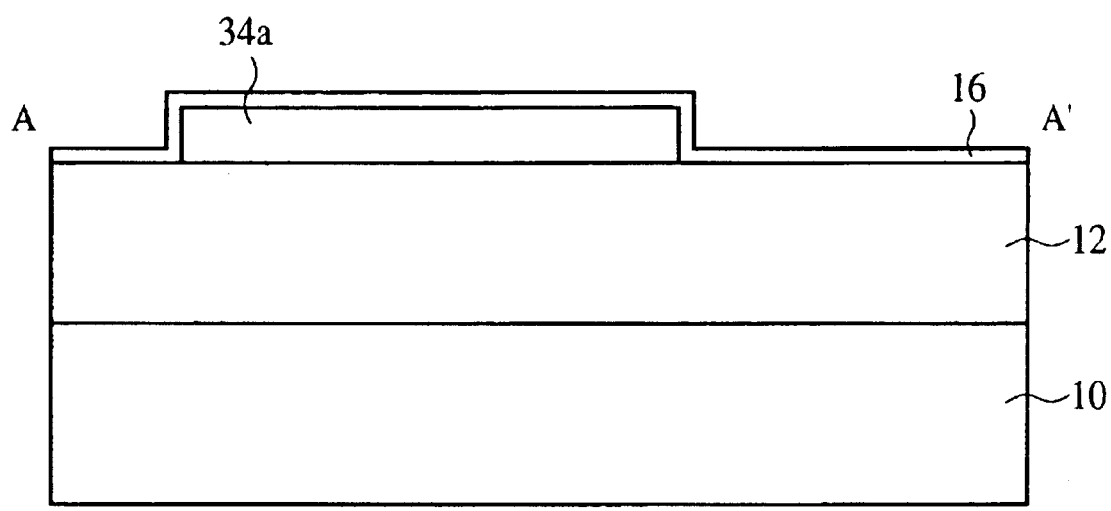
FIGS. 15A and 15B are views of the semiconductor device according to the third embodiment of the present invention in the steps of the method for fabricating the same, which explain the method (Part 1).
Figure 15B:
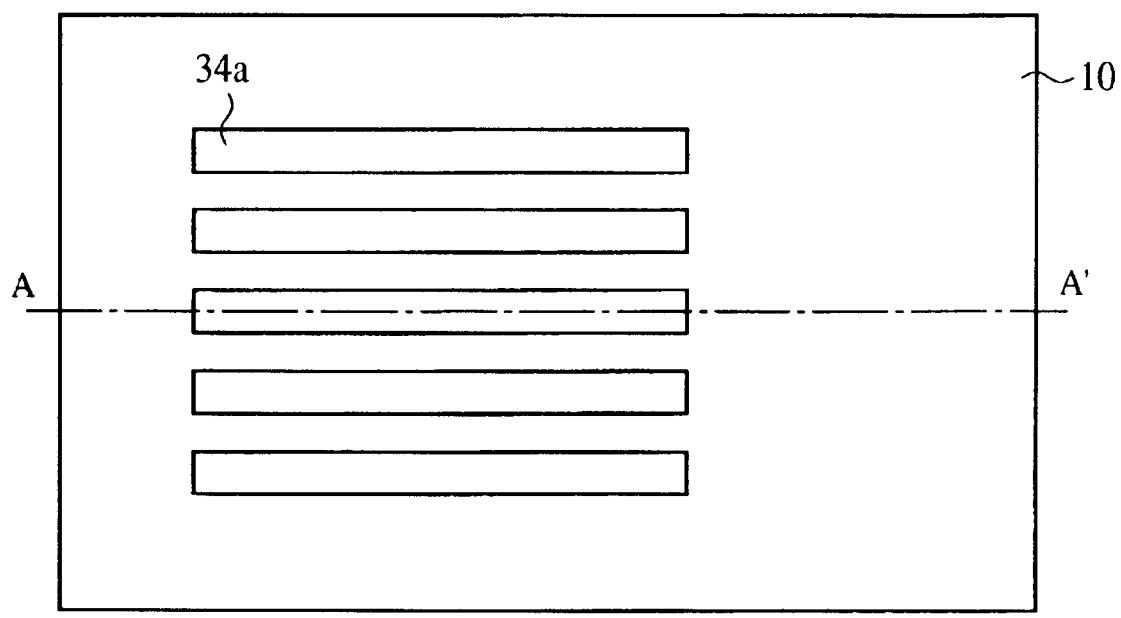
Figure 16A:
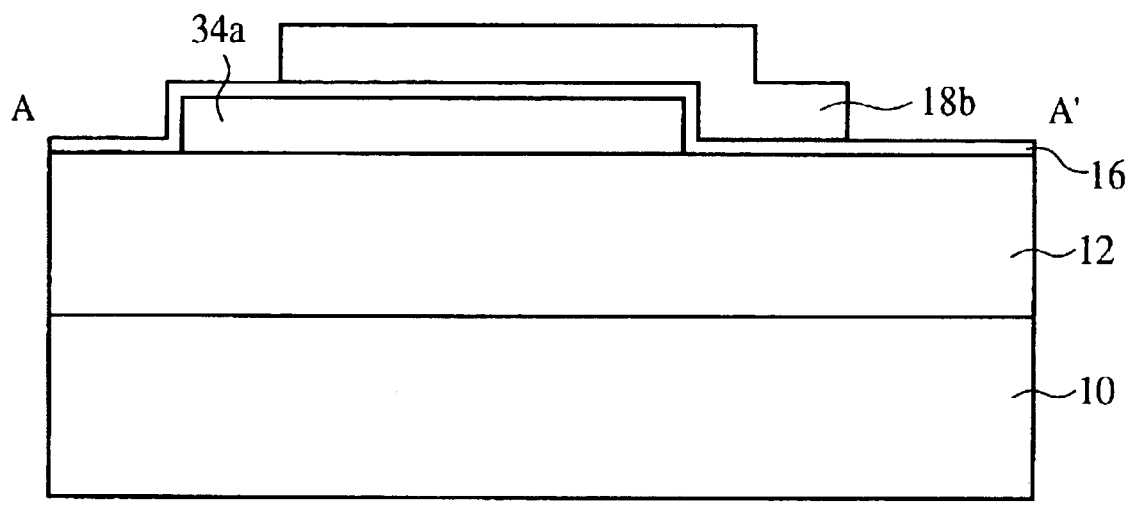
FIGS. 16A and 16B are views of the semiconductor device according to the third embodiment of the present invention in the steps of the method for fabricating the same, which explain the method (Part 2).
Figure 16B:
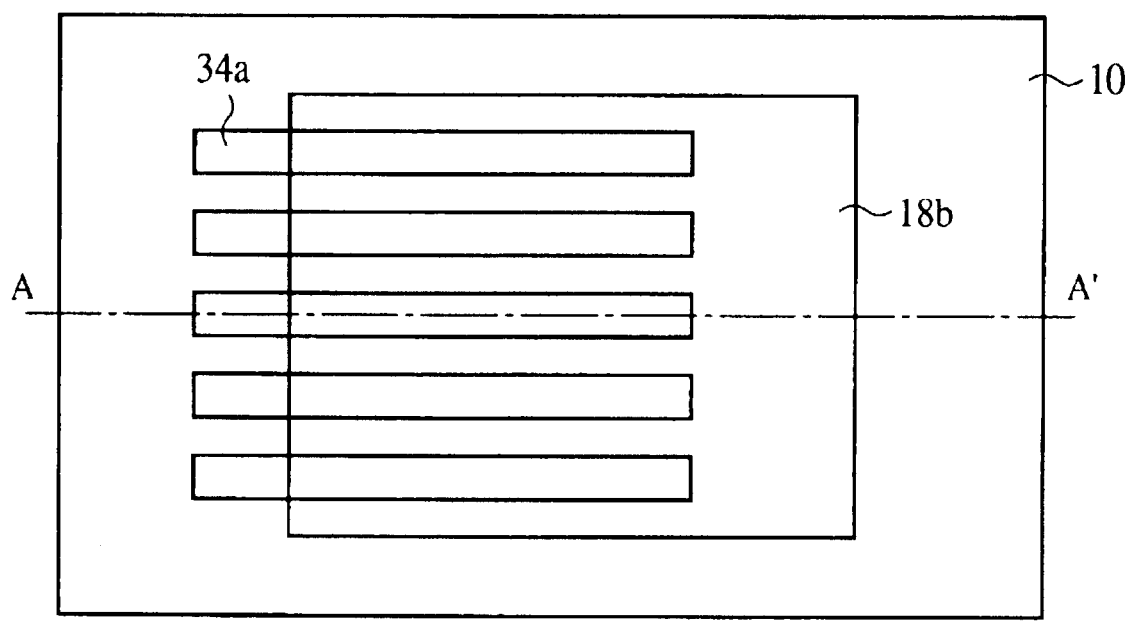
Figure 17A:
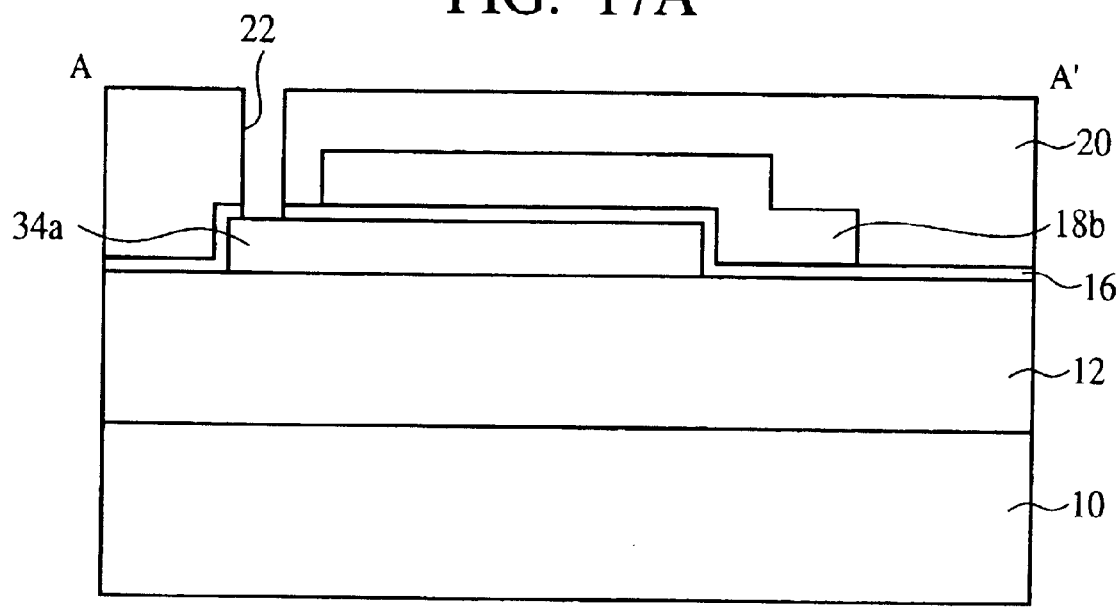
FIGS. 17A and 17B are views of the semiconductor device according to the third embodiment of the present invention in the steps of the method for fabricating the same, which explain the method (Part 3).
Figure 17B:
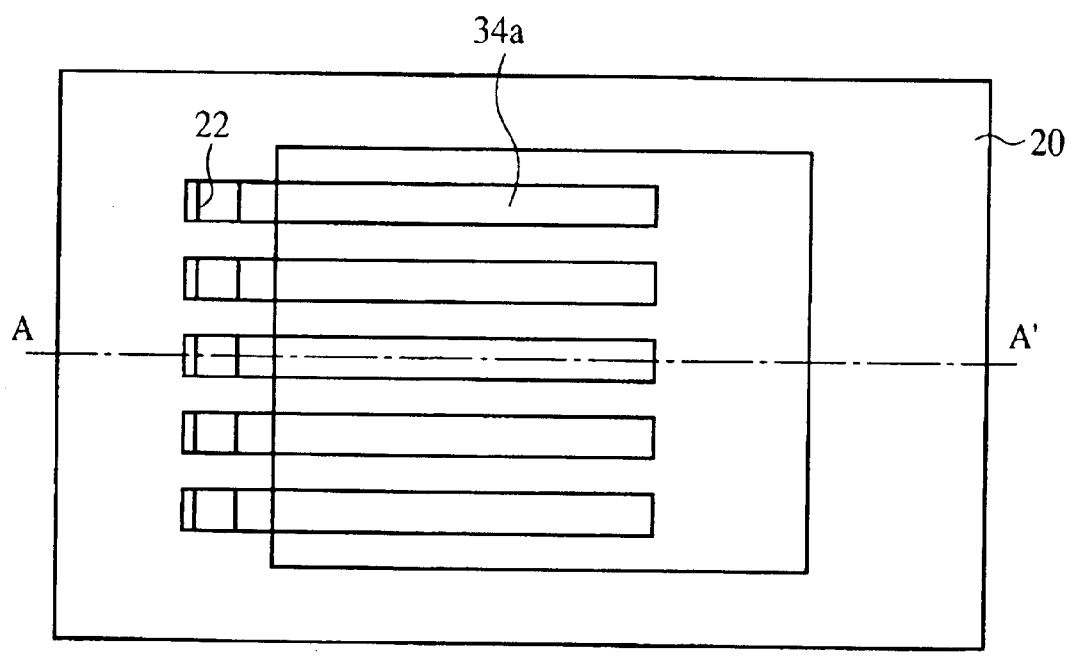
Figure 19A:
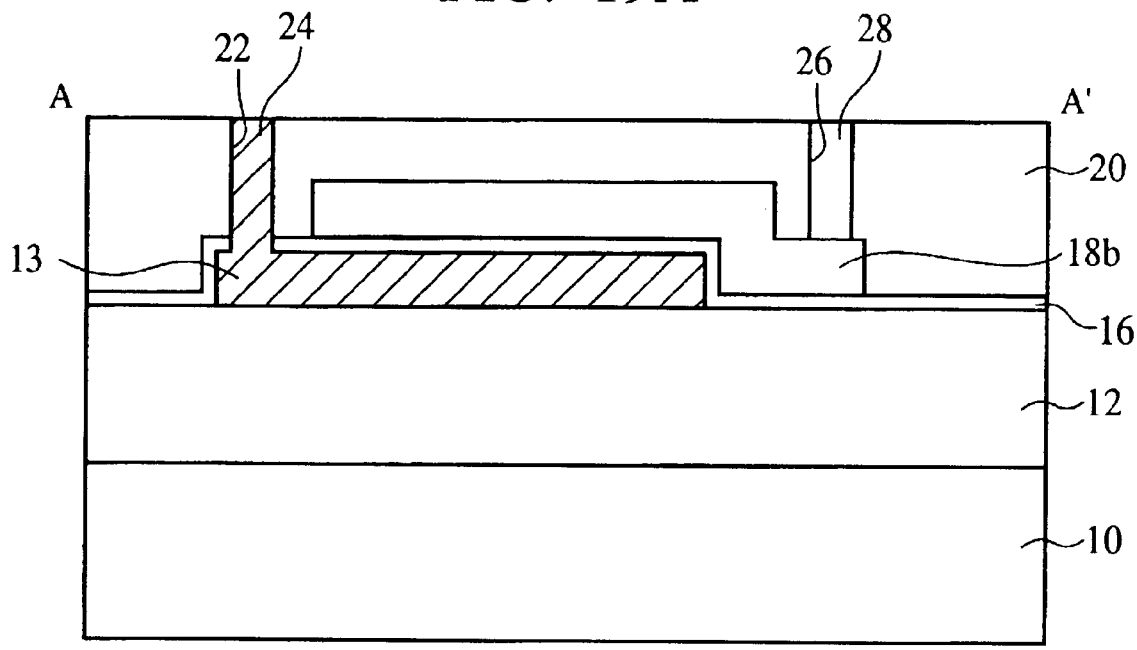
FIGS. 19A and 19B are views of the semiconductor device according to the third embodiment of the present invention in the steps of the method for fabricating the same, which explain the method (Part 5).
Figure 19B:
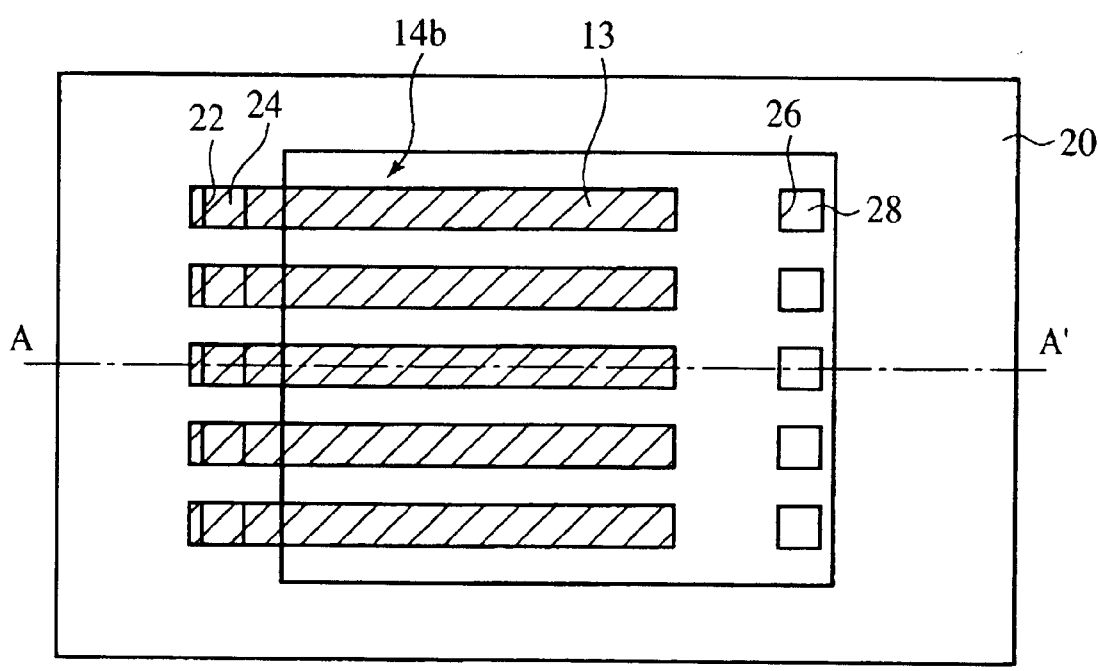
Figure 20A:
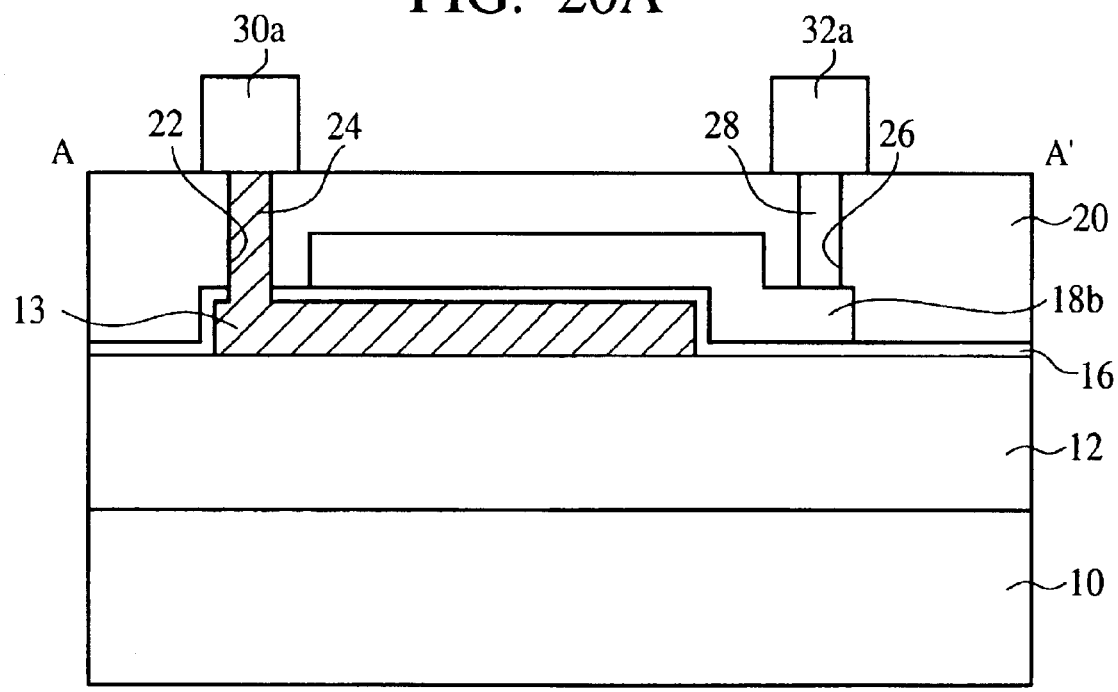
FIGS. 20A and 20B are views of the semiconductor device according to the third embodiment of the present invention in the steps of the method for fabricating the same, which explain the method (Part 6).
Figure 20B:
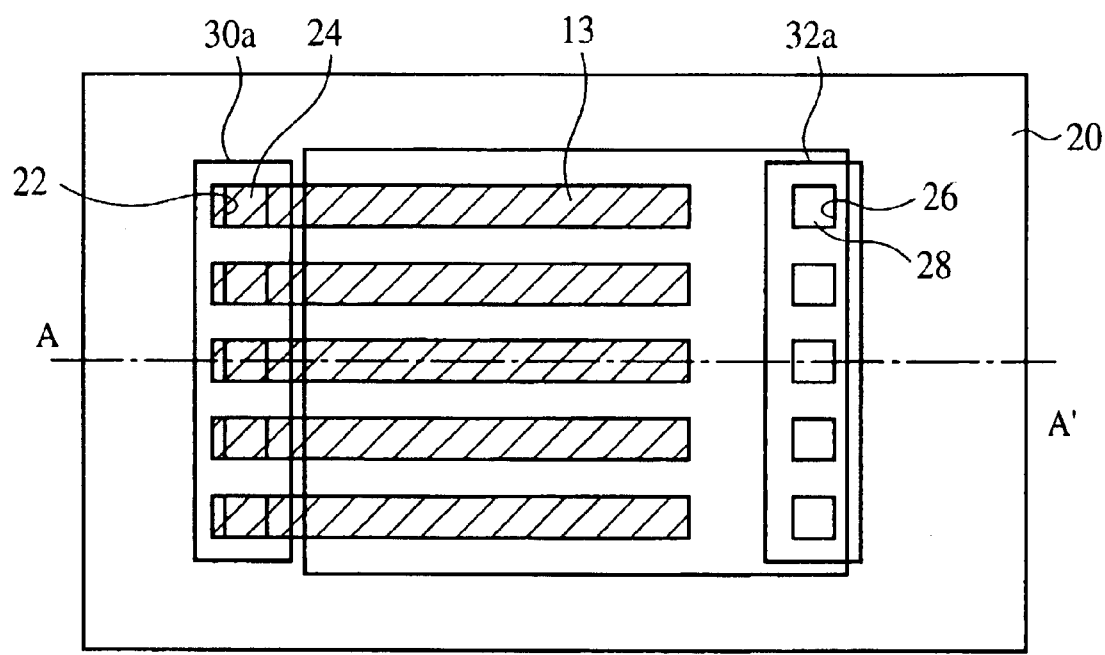

Then, the method for fabricating the semiconductor device according to the present embodiment will be explained with reference to FIGS. 15A to 20B. FIGS. 15A to 20B are views of the semiconductor device in the steps of the method for fabricating the semiconductor device according to the present embodiment, which show the method. FIG. 15A is a sectional view, and FIG. 15B is a plan view. FIG. 15A is the sectional view along the line A–A' in FIG. 15B. FIG. 16A is a sectional view, and FIG. 16B is a plan view. FIG. 16A is the sectional view along the line B–B' in FIG. 16B. FIG. 17B is a sectional view, and FIG. 17B is a plan view. FIG. 17A is the sectional view along the line A–A' in FIG. 17B. FIGS. 18A to 19A are sectional views, and FIG. 19B is a plan view. FIG. 19A is the sectional view along the line A–A' in FIG. 19B. FIG. 20A is a sectional view, and FIG. 20B is a plan view. FIG. 20A is the sectional view along the line A–A'.

First, in the same way as in the method for fabricating the semiconductor device described above with reference to FIG. 2A, an insulation film 12 is formed on a semiconductor substrate 10.

Next, in the same way as in the method for fabricating the semiconductor device described above with reference to FIG. 2A, a polysilicon layer is formed on the entire surface. Then, the polysilicon layer is patterned by photolithography to form a plurality of strip-shaped sectional electrodes 34a of polysilicon arranged in stripes.

The following steps up to the step of improving film quality of the capacitor dielectric film 16 by heat processing including the film quality improving step are the same as in the method for fabricating the semiconductor device described above with reference to FIG. 2A, and their explanation will not be repeated (FIG. 15A).

Next, a 200 nm-thickness Al layer is formed on the entire surface by, e.g., sputtering or CVD. Then, the Al layer is patterned by photolithography to form the upper electrodes 18b of the Al layer as shown in FIGS. 16A and 16B.

Then, in the same way as in the method for fabricating the semiconductor device described above with reference to FIG. 2C, the inter-layer insulation film 20 is formed.

Next, as shown in FIGS. 17A and 17B, the openings 22 are formed in the inter-layer insulation film 20 and the capacitor dielectric film 16 down to the respective sectional electrodes 34a of polysilicon arranged in stripes.

Figure 18A:
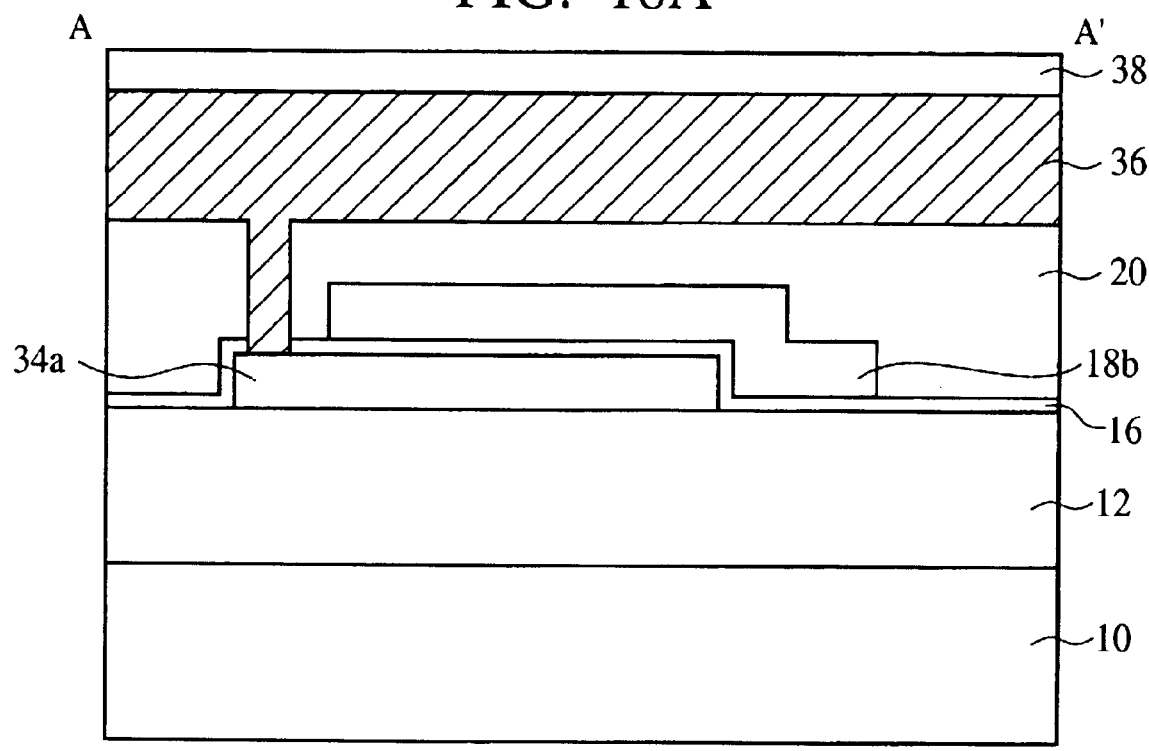
FIGS. 18A and 18B are views of the semiconductor device according to the third embodiment of the present invention in the steps of the method for fabricating the same, which explain the method (Part 4).

Then, in the same way as in the method for fabricating the semiconductor device described above with reference to FIG. 2C, the Al layer 36 and the absorption layer 38 are formed (FIG. 18A).

Figure 18B:
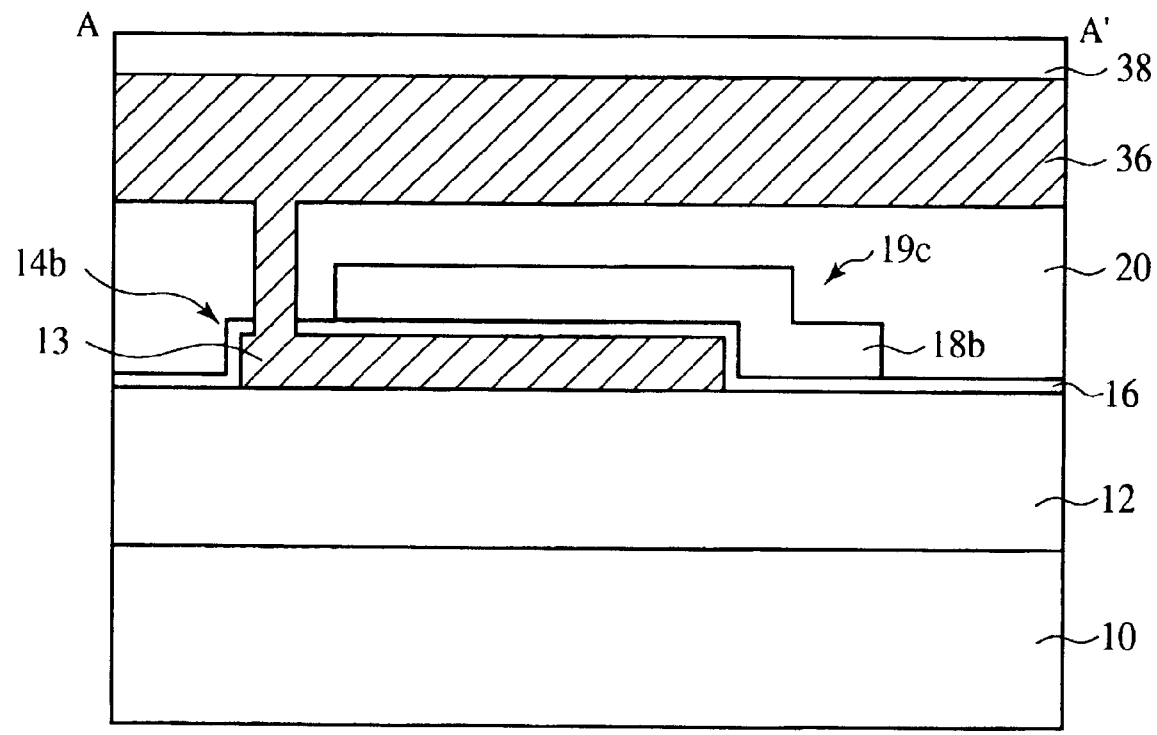

In the same way as in the method for fabricating the semiconductor device described above with reference to FIG. 3A, the sectional electrodes 34a of polysilicon are substituted with aluminum by polysilicon-aluminum substitution. The lower electrode 14b is thus formed in the strip-shaped sectional electrodes 13 arranged in stripes. Thus, the capacitor 19c comprising the lower electrode 14b, the capacitor dielectric film 16 and the upper electrode 18b is formed (FIG. 18B).

Next, in the same way as in the method for fabricating the semiconductor device described above with reference to FIG. 13B, the absorption layer 38 an the Al layer 36 are polished until the upper surface of the inter-layer insulation film 20 is exposed. Thus, the conductor plugs 24 are buried in the openings 22. The Al layer forming the conductor plugs 24 is the Al layer used in substituting the upper electrodes 40 of polysilicon with aluminum, whereby the conductor layer 13 and the conductor plugs 24 are formed of one and the same Al layer integrally with one another.

Then, as shown in FIGS. 19A and 19B, the openings 26 are formed in the inter-layer insulation film 20 down to the upper electrode 18b.

Next, the conductor plugs 28 of, e.g., W/TiN/Ti are formed in the openings 26.

Then, a 500 nm-thickness Al layer is formed on the entire surface by, e.g., sputtering. Next, the Al layer is patterned by photolithography. Thus, as shown in FIGS. 20A and 20B, the electrode pads 30a of Al connected to a plurality of the conductor plugs 24, and the electrode pads 32a of Al connected to a plurality of conductor plugs 28 are formed.

Thus, the semiconductor device according to the present embodiment is fabricated.

The method for fabricating the semiconductor device according to the present embodiment is characterized mainly in that the strip-shaped sectional electrodes of polysilicon divided in stripes are substituted with aluminum to thereby form the lower electrodes.

In the above-described embodiments, the lower electrodes 34 of polysilicon formed solid are substituted with aluminum through the respective single openings 22, and the lower electrodes 34 to be substituted through the respective single openings 22 have a very large volume. Accordingly, in the above-described embodiments, it takes long time to substitute the lower electrodes 34 of polysilicon with aluminum, or the respective lower electrodes 34 of polysilicon cannot be often completely substituted with aluminum.

In contrast to this, in the present embodiment, strip-shaped sectional electrodes 13 of polysilicon divided in stripes are substituted with aluminum. The openings 22 are respectively formed in the strip-shaped sectional electrodes 13, whereby the sectional electrodes 13 to be substituted through the respective single openings 22 can have a small volume. Thus, according to the present embodiment, the lower electrode can be substituted with aluminum for a short period of time, or the lower electrode can be substituted with aluminum without failure.

In the present embodiment, in which the lower electrode 14b are divided in stripes, an area of the upper surface of the lower electrode 14b is smaller than an area of the upper surfaces of the lower electrode 14 of the semiconductor device according to the first embodiment, but the side surfaces of the sectional electrodes 13 are opposed to the upper electrode 18b with the capacitor dielectric film 16 therebetween, whereby an opposed surface between the lower electrode 14b and the upper electrode 18b is sufficiently ensured. Accordingly, even when the lower electrode 14b is divided in stripes as in the present embodiment, an electrostatic capacitance of the capacitor is never small.

A Fifth Embodiment

Figure 21A:
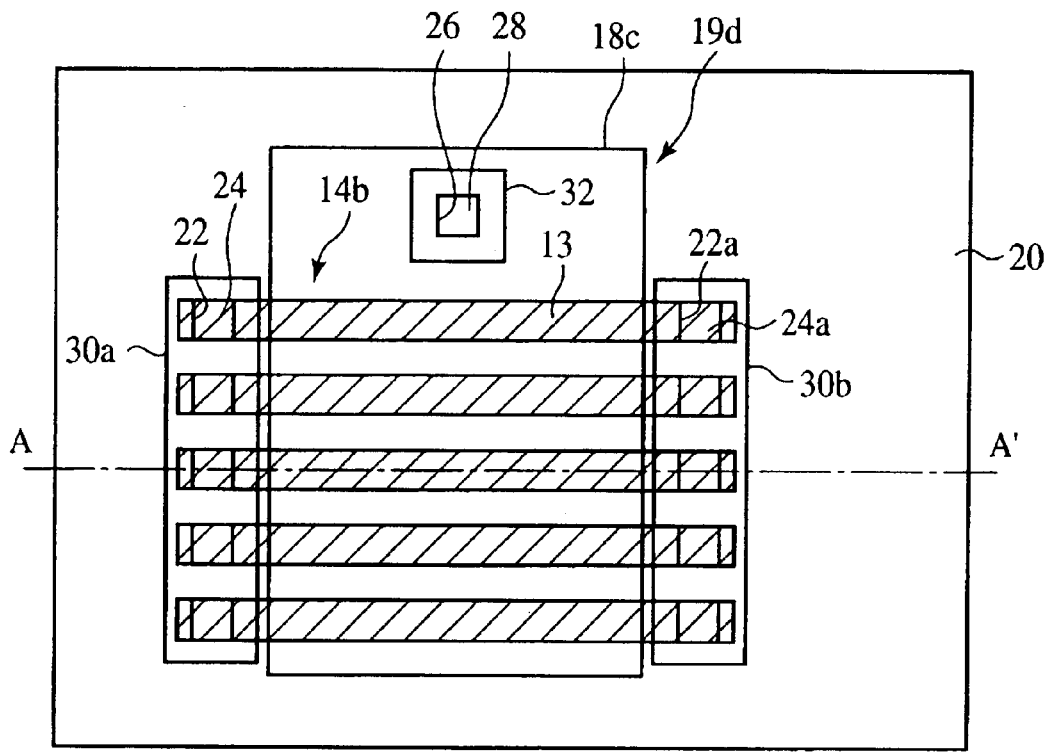
FIGS. 21A and 21B are diagrammatic views of the semiconductor device according to a fifth embodiment of the present invention.
Figure 21B:
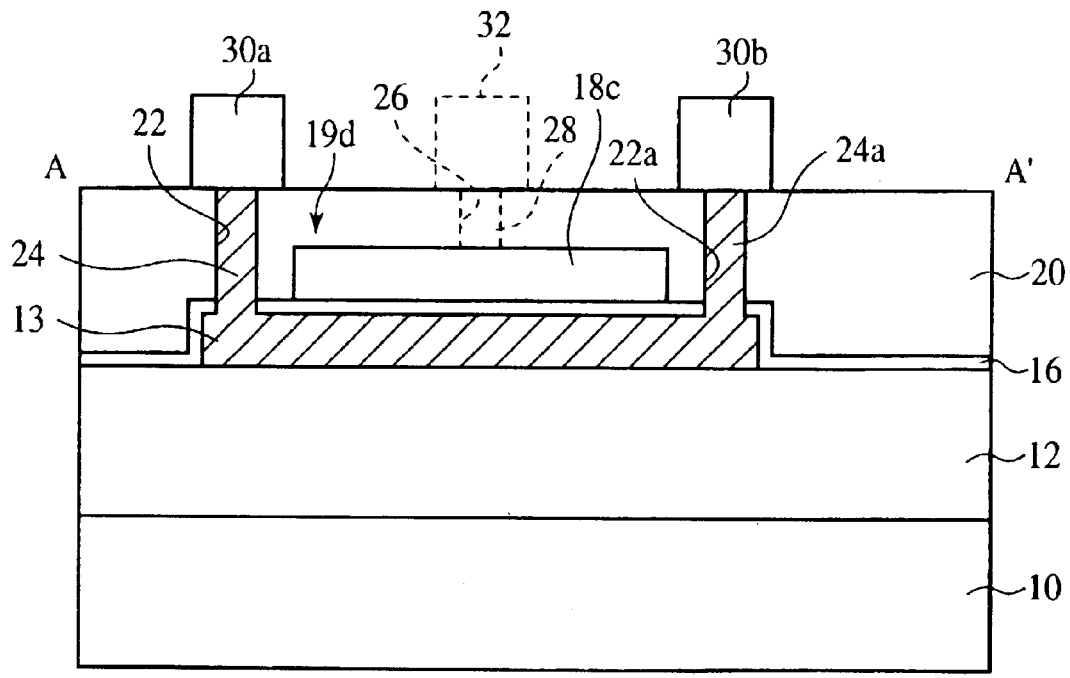

The semiconductor device according to a fifth embodiment of the present invention will be explained with reference to FIGS. 21A and 21B. FIGS. 21A and 21B are diagrammatic views of the semiconductor device according to the present embodiment. FIG. 21A is a plan view, and FIG. 21B is a sectional view. FIG. 21B is the sectional view along the line A–A' in FIG. 21A. The same members of the present embodiment as those of the semiconductor device according to the first to the fourth embodiments shown in FIGS. 1A to 20B are represented by the same reference numbers not to repeat or to simplify their explanation.

The semiconductor device according to the present embodiment is characterized mainly in that openings 22 and openings 22a are formed respectively down to one ends and down to the other ends of the stripe-shaped sectional electrodes 13 arranged in stripes.

As shown in FIGS. 21A and 21B, the openings 22, 22a are formed down to the respective ends of the sectional electrodes 13 arranged in stripes.

Conductor plugs 24 are buried in the openings 22. Conductor plugs 24a are buried in the openings 22a. An Al layer forming the conductor plugs 24, 24a is an Al layer used in substituting the polysilicon with aluminum, and accordingly, the sectional electrodes 13 and the conductor plugs 24, 24a are formed of one and the same Al layer integrally with one another.

An upper electrode 18c of Al is formed on the lower electrode 14b with a capacitor dielectric film 16 formed therebetween.

The lower electrode 14b, the capacitor dielectric film 16 and the upper electrode 18c constitute a capacitor 19d.

An electrode pad 30a connected to a plurality of the conductor plugs 24, and an electrode pad 30b connected to a plurality of the conductor plugs 24 are formed on an inter-layer insulation film 20.

As described above, the semiconductor device according to the present embodiment is characterized mainly in that the openings 22, 22a are formed respectively down to one ends of the sectional electrodes 13 and down to the other ends of the sectional electrodes 13.

In the semiconductor device according to the fourth embodiment shown in FIGS. 14A to 20B, the sectional electrodes 34a of polysilicon are substituted with aluminum through the openings 22, which are formed only on one sides, and accordingly it takes some time to substitute the sectional electrodes 34a of polysilicon with aluminum.

In contrast to this, according to the present embodiment, the sectional electrodes 34a of polysilicon are substituted with aluminum through the openings 22, 22a formed respectively on one sides and the other sides of the strip-shaped sectional electrodes 13, whereby a period of time for substituting the sectional electrodes 34a of polysilicon with aluminum can be half.

A Sixth Embodiment

Figure 22A:
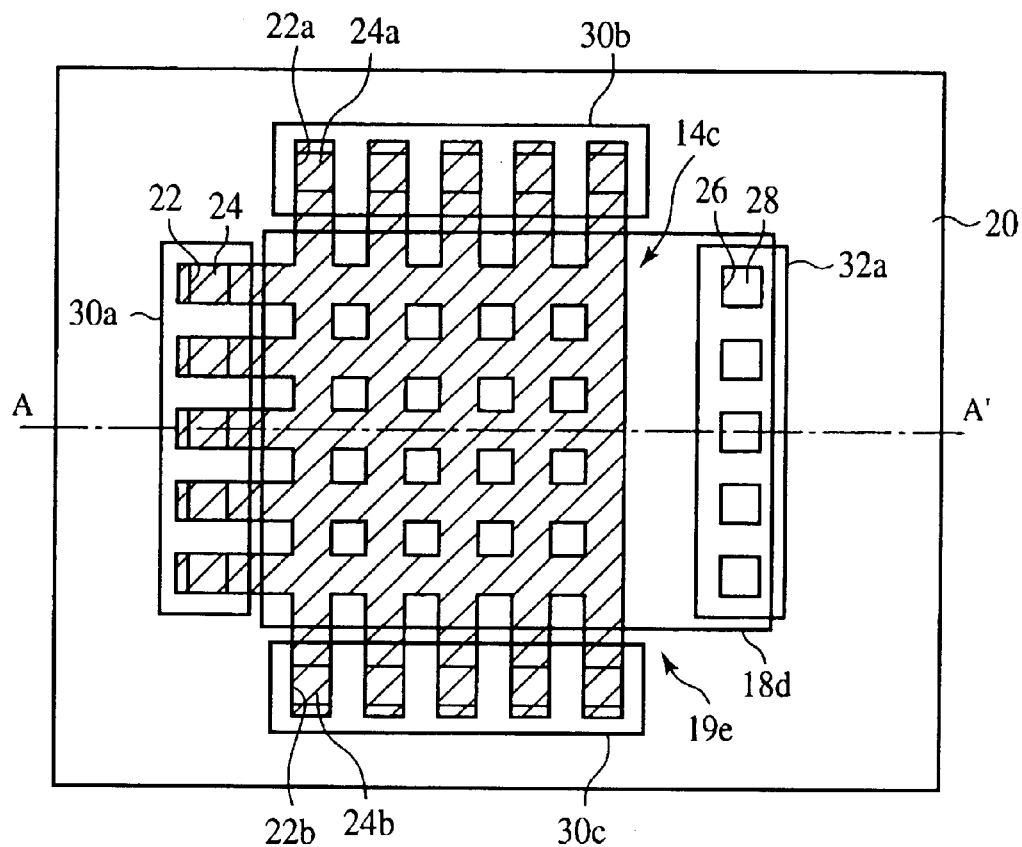
FIGS. 22A and 22B are diagrammatic views of the semiconductor device according to a sixth embodiment of the present invention.
Figure 22B:
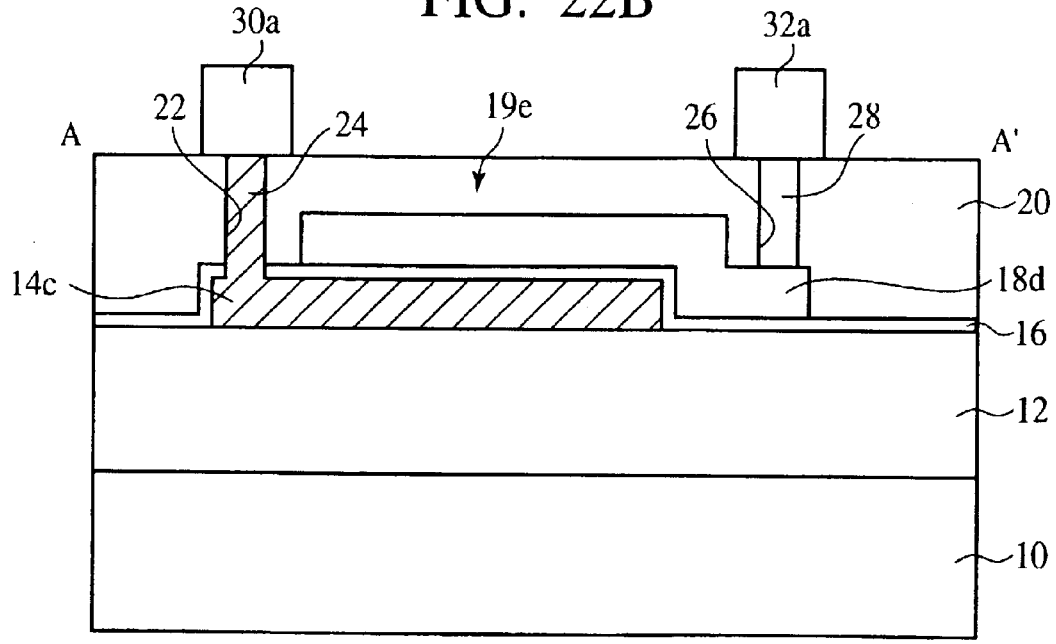

The semiconductor device according to a sixth embodiment of the present invention will be explained with reference to FIGS. 22A and 22B. FIGS. 22A and 22B are diagrammatic views of the semiconductor device according to the present embodiment. FIG. 22A is a plan view, and FIG. 22B is a sectional view. FIG. 22B is the sectional view along the line A–A' in FIG. 22A. The same members of the present embodiment as those of the semiconductor device according to the first to the fifth embodiments and the method for fabricating the same shown in FIGS. 1A to 21B are represented by the same reference numbers not to repeat or to simplify their explanation.

The semiconductor device according to the present embodiment is characterized mainly in that the lower electrodes 14c are formed in a mesh.

As shown in FIGS. 22A and 22B, in the semiconductor device according to the present embodiment, a lower electrode 14c is formed in a mesh.

An upper electrode 18d is formed on the lower electrode 14c with a capacitor dielectric film 16 formed therebetween.

The lower electrode 14c, the capacitor dielectric film 16 and the upper electrode 18d constitute a capacitor 19e.

In an inter-layer insulation film 20, a plurality of openings 22, 22a, 22b are formed respectively down to the ends of the lower electrode 14c formed in a mesh.

Conductor plugs 24, 24a, 24b are buried respectively in the openings 22, 22a, 22b.

An Al layer forming the conductor plugs 24, 24a, 24b is an Al layer used in substituting the polysilicon with the aluminum, and the accordingly, the lower electrode 14c and the conductor plugs 24, 24a, 24b are formed of one and the same Al layer integrally with one another.

An electrode pad 30a of Al connected to a plurality of the conductor plugs 24, an electrode pad 30b of Al connected to a plurality of conductor plugs 24a, and an electrode pad 30c of Al connected to a plurality of the conductor plugs 24b are formed on the inter-layer insulation film 20 with the conductor plugs 24, 24a, 24b buried in.

The lower electrode 14c may be thus formed in a mesh. In the present embodiment, the lower electrode of polysilicon is formed in a mesh, a plurality of the openings 22, 22a, 22b are formed down to the lower electrode of polysilicon formed in a mesh, and the polysilicon is substituted with aluminum through the openings 22, 22a, 22c. Thus, in the present embodiment as well, the lower electrode of polysilicon can be substituted with aluminum in a short period of time and without failure.

In the present embodiment, the lower electrode 14c, which is formed in a mesh, has a smaller area of the upper surface thereof than an area of the upper surface of the lower electrode 14 of the semiconductor device according to the first embodiment. However, the side surface of the lower electrode 14c formed in a mesh is opposed to the upper electrode 18d with the capacitor dielectric film 16 formed therebetween, whereby a sufficient opposed area between the lower electrode 14c and the upper electrode 18d is ensured. Accordingly, even in the present embodiment, in which the lower electrode 14c is formed in a mesh, an electrostatic capacity of the capacitor is never small.

A Seventh Embodiment

Figure 23A:
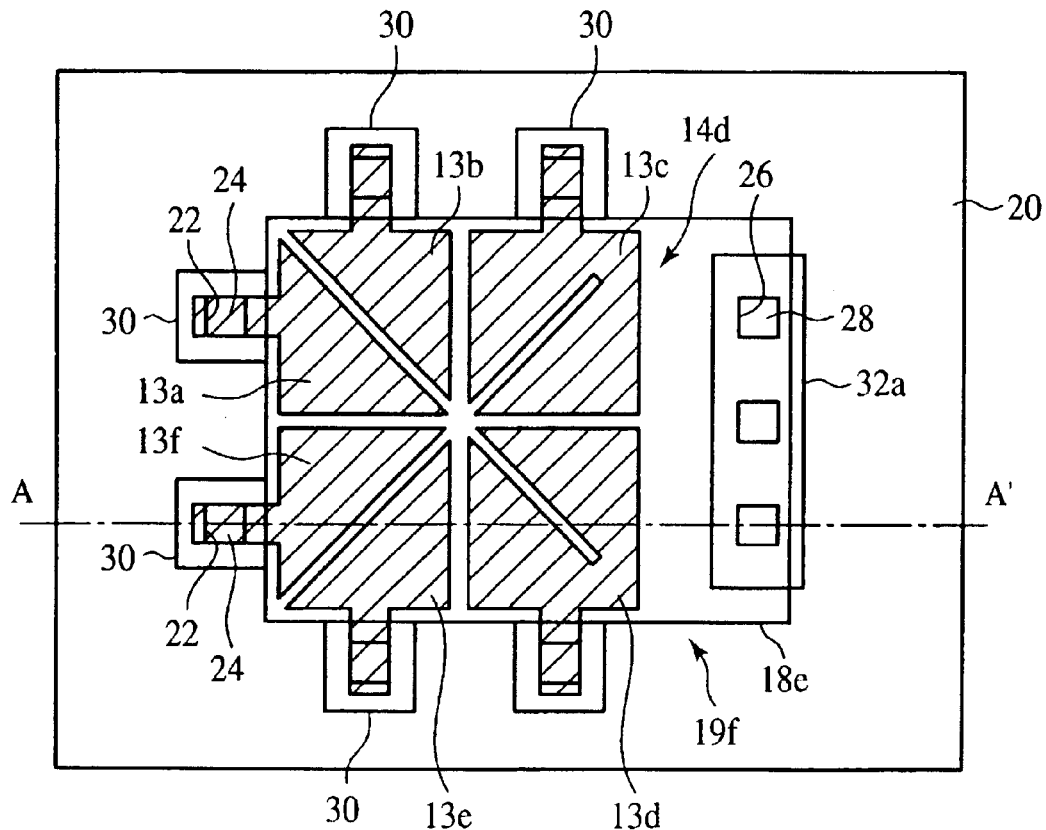
FIGS. 23A and 23B are diagrammatic views of the semiconductor device according to a seventh embodiment of the present invention.
Figure 23B:
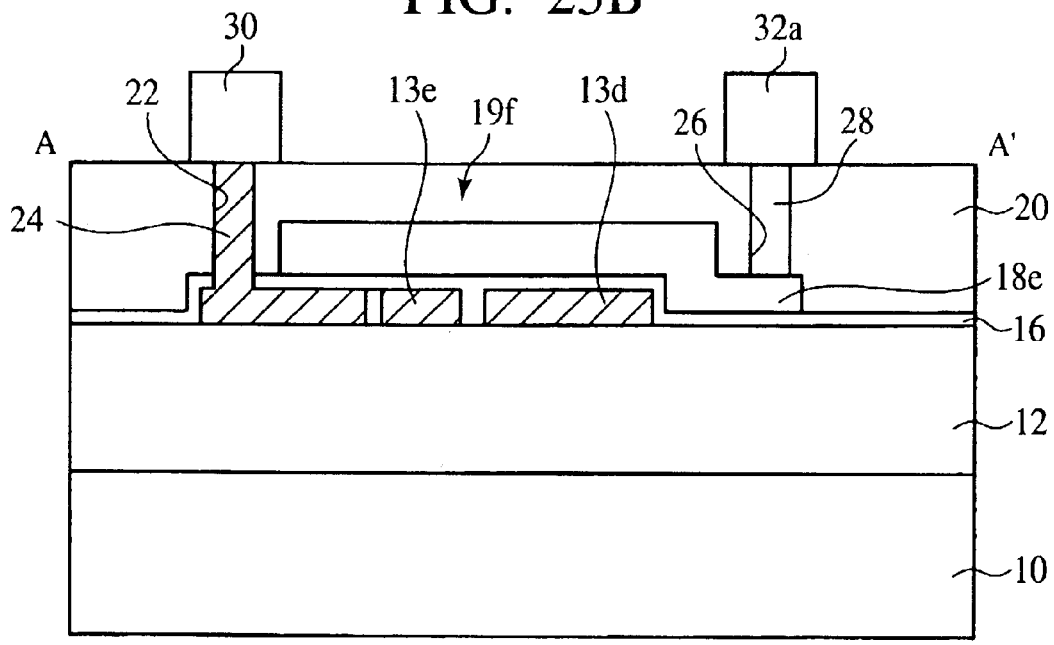

The semiconductor device according to a seventh embodiment of the present invention and the method for fabricating the semiconductor device will be explained with reference to FIGS. 23A and 23B. FIGS. 23A and 23B are diagrammatic views of the semiconductor device according to the present embodiment. FIG. 23A is a plan view, and FIG. 23B is a sectional view. FIG. 23B is the sectional view along the line A–A' in FIG. 23A. The same members of the present embodiment as those of the semiconductor device according to the first to the sixth embodiment and the method for fabricating the same shown in FIGS. 1A to 22B are represented by the same reference numbers not to repeat or to simplify their explanation.

The semiconductor device according to the present embodiment is characterized mainly in that a lower electrode is radially divided.

As shown in FIGS. 23A and 23B, the lower electrode 14d is radially divided. A plurality of fan-shaped sectional electrodes 13a–13f which are radially arranged are formed of an Al layer which is a metal substituted layer.

An upper electrode 18e is formed on the lower electrode 14d with a capacitor dielectric film 16 formed therebetween.

The lower electrode 14d, the capacitor dielectric film 16 and the upper electrode 18e constitute a capacitor 19f.

Openings 22 are formed in an inter-layer insulation film 20 respectively down to the radially arrange sectional electrodes 13a–13f.

Conductor plugs 24 are buried in the openings 22. An Al layer forming the conductor plugs 24 is an Al layer used in substituting the polysilicon with the aluminum, and accordingly, the sectional electrodes 13a–13f and the conductor plugs 24 are formed of one and the same Al layer.

Thus, the semiconductor device according to the present embodiment is constituted.

Even when the lower electrode 14d is thus radially divided, a volume polysilicon to be substituted through the respective openings 22 can be small, whereby the polysilicon can be substituted with aluminum in a short period of time without failure.

An Eighth Embodiment

Figure 24A:
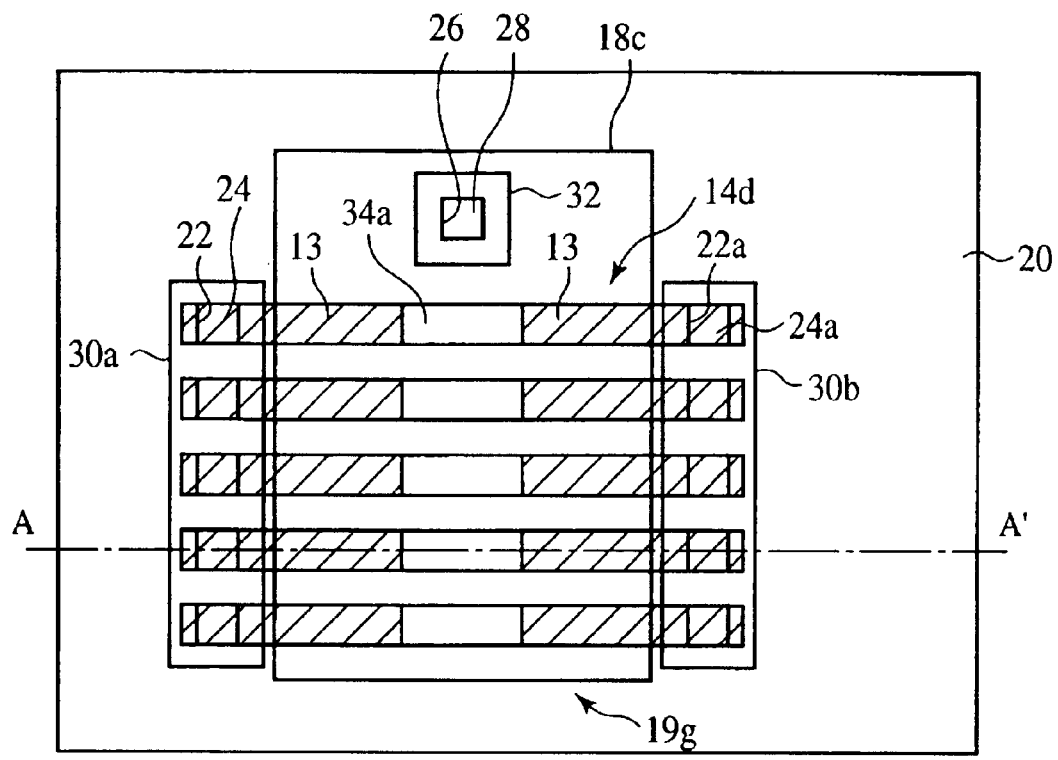
FIGS. 24A and 24B are diagrammatic views of the semiconductor device according to an eighth embodiment of the present invention.
Figure 24B:
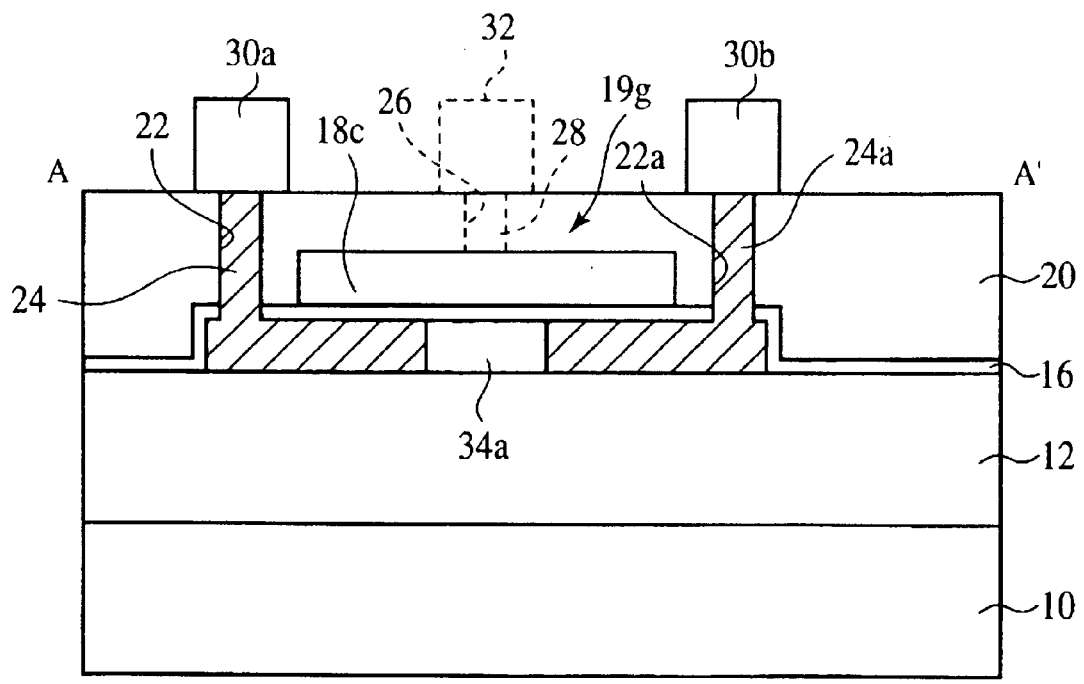

The semiconductor device according to an eighth embodiment of the present invention will be explained with reference to FIGS. 24A and 24B. FIGS. 24A and 24B are diagrammatic views of the semiconductor device according to the present embodiment. FIG. 24A is a plan view, and FIG. 24B is a sectional view. FIG. 24B is the sectional view along the line A–A' in FIG. 24A. The same members of the present embodiment as those of the first to the seventh embodiments and the method for fabricating the same shown in FIGS. 1A to 23B are represented by the same reference numbers not to repeat or to simplify their explanation.

The semiconductor device according to the present embodiment is characterized mainly in that middle parts of sectional electrodes of polysilicon arranged in stripes are not substituted with aluminum.

As shown in FIGS. 24A and 24B, in the present embodiment, the strip-shaped sectional electrodes 34a of polysilicon arranged in stripes (see FIGS. 24A and 24B) have the middle parts left not substituted with aluminum. A dopant is implanted in the sectional electrodes 34a of polysilicon at, e.g., a relatively low concentration of $1 \times 10^{15} - 1 \times 10^{19}$ cm$^{-3}$.

In order to leave the middle parts of the sectional electrodes 34a of polysilicon not substituted with aluminum, a temperature, a period of time, etc. for substituting the sectional electrodes 34a of polysilioen with aluminum may be suitably set. Thus, the sectional electrodes 34a of polysilicon can be substituted with aluminum over a prescribed length.

An upper electrode 18c is formed on the lower electrode 14d with a capacitor dielectric film 16 formed therebetween.

The lower electrode 14d, the capacitor dielectric film 16 and the upper electrode 18c constitute a capacitor 19g.

Thus, the semiconductor device according to the present embodiment is constituted.

As described above, the semiconductor device according to the present embodiment is characterized mainly in that the middle parts of the sectional electrodes 34a of polysilicon are left not substituted with aluminum.

In the capacitor 19g of such constitution, when a voltage is applied between the lower electrode 14d and the upper electrode 18c, a depletion region is extended in the non-substituted polysilicon layer 34a, and an electrostatic capacity varies. Thus, according to the present embodiment, the capacitor can have variable electrostatic capacities.

Modifications

The present invention is not limited to the above-described embodiments and can cover other various modifications.

For example, in the above-described embodiments, a material of the absorption layer is Ti. However, a material of the absorption layer is not essentially Ti and can be a material which can absorb silicon, such as Co, Ni, Ru, Ta or others.

In the above-described embodiments, polysilicon is substituted with Al. However, a metal substituting polysilicon is not essentially Al and can be, e.g., Cu, Au, Pt, Ag, Ru or others.

In the above-described embodiments, polysilicon is substituted with a metal to thereby form the lower electrode and the upper electrode. However, a layer to be substituted with a metal is not essentially polysilicon, and the lower electrode and the upper electrode may be formed by substituting single crystal Si or others with a metal.

In the above-described embodiments, the layers to be substituted with a metal, i.e., the lower electrode and the upper electrode are formed of Si. However, a material of the layers to be substituted with a metal is not essentially Si. A material to be substituted with a metal can be, e.g., SiGe, Ge or others.

In the above-described embodiments, a material of the layers to be substituted with a metal, i.e., the lower electrode and the upper electrode is a semiconductor. However, a material to be substituted with a metal is not essentially a semiconductor.

In the above-described embodiments, the electrode pads are connected to the conductor plugs. However, the conductor plugs may be connected not only to the electrode pads but also to, e.g., wiring layers.

In the above-described embodiments, the lower electrodes are divided in stripes or radially. However, the lower electrodes are not divided essentially in stripes or radially. That is, the lower electrodes may be divided in configurations which facilitate the substitution of the polysilicon with the aluminum.

In the above-described embodiments the capacitors are mounted on semiconductor devices. However, the capacitors may not be mounted essentially on semiconductor devices. For example, the present invention is applicable to a single capacitor.

In the above-described embodiments, the absorption layer 38 is formed. However, the absorption layer 38 is not essential. The Al layer 36 is formed sufficiently thick, which permits the polysilicon to be sufficiently substituted with the aluminum in the absence of the absorption layer 38.

In Modification 1 of the second embodiment, the lower electrode 14 is formed on one and the same layer as the gate electrode of the transistor, but this is not essential. For example, the lower electrode 14 may be formed on one and the same layer as the base outgoing electrode, etc. of a bipolar transistor.

In Modification 3 of the second embodiment, the Al layer 36 is utilized to form the interconnection layers 31, 33. However, the Al layer 36 may be utilized to form the electrode pad, and in this case, the lower electrode 14, the conductor plug 24 and the electrode pad are formed of one and the same Al layer integrally with one another, and the upper electrode 18a, the conductor plug 28a and the electrode pad are formed of one and the same Al layer integrally with one another.

In the fourth to the eighth embodiments, the lower electrodes alone are formed of the metal substituted layer, but both the lower electrodes and the upper electrodes may be formed of the metal substituted layer.

In the fourth to the eighth embodiments, the lower electrodes are divided, but the upper electrodes may be divided.

What is claimed is:

1. A capacitor comprising a lower electrode formed on a substrate, an upper electrode opposed to the lower electrode, and a capacitor dielectric film formed between the lower electrode and the upper electrode, at least one of the lower electrode and the upper electrode being an electrode of a metal substituted layer, the metal substituted layer being formed by substituting a semiconductor constituent atom of the at least one of the lower electrode and the upper electrode with a metal atom.

2. A capacitor according to claim 1, further comprising an insulation film formed on the capacitor, an opening is formed in the insulation film down to the electrode of the metal substituted layer, and a conductor plug formed integrally with the electrode of the metal substituted layer in the opening.

3. A capacitor according to claim 2, wherein the electrode of the metal substituted layer is divided in a plurality of sectional electrodes, openings are formed for the respective sectional electrodes, and conductor plugs are formed in the respective openings integrally with the sectional electrodes.

4. A capacitor according to claim 3, wherein the electrode of the metal substituted layer is divided in stripes, and the sectional electrodes are formed in stripes.

5. A capacitor according to claim 4, wherein a plurality of the openings are formed down to both ends of the sectional electrodes.

6. A capacitor according to claim 3, wherein the electrode of the metal substituted layer is radially divided, and the sectional electrodes are formed in fans.

7. A capacitor according to claim 2, wherein the electrode of the metal substituted layer is formed in a mesh.

8. A capacitor according to claim 7, wherein a plurality of the openings are formed down to vicinities of the ends of the mesh-shaped electrode.

9. A capacitor according to claim 1, wherein the lower electrode or the upper electrode includes a semiconductor layer which is not substituted with the metal.

10. A capacitor according to claim 9, wherein the semiconductor layer, is in contact with the capacitor dielectric film.

11. A capacitor according to claim 1, wherein the metal substituted layer is formed of Al, Cu, Au, Pt, Ag or Ru.

12. A capacitor according to claim 2, further comprising on the insulation film an electrode pad or a wiring layer integrally formed with the conductor plug.

13. A capacitor according to claim 2, wherein a concentration gradient of the atom substituted with the metal atom is present from the electrode of the metal substituted layer toward the conductor plug.

14. A capacitor according to claim 12, wherein a concentration gradient of the atom substituted with the metal atom is present in the electrode pad or in the wiring layer.

15. A capacitor comprising a lower electrode formed on a substrate, an upper electrode opposed to the lower electrode, and a capacitor dielectric film formed between the lower electrode and the upper electrode, at least one of the lower electrode and the upper electrode being an electrode of a metal substituted layer, wherein a concentration gradient of a semiconductor constituent atom to be substituted is present in the electrode of the metal substituted layer.

16. A capacitor according to claim 15, further comprising an insulation film formed on the capacitor, an opening is formed in the insulation film down to the electrode of the metal substituted layer, and a conductor plug formed integrally with the electrode of the metal substituted layer in the opening.

17. A capacitor according to claim 15, wherein the metal substituted layer is formed of Al, Cu, Au, Pt, Ag or Ru.

* * * * *